US006556100B2

(12) United States Patent
Takamine

(10) Patent No.: US 6,556,100 B2
(45) Date of Patent: Apr. 29, 2003

(54) SURFACE ACOUSTIC WAVE FILTER WITH A PASSBAND FORMED BY A LONGITUDINALLY COUPLED FILTER AND A RESONATOR INDUCTANCE

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/931,780

(22) Filed: Aug. 17, 2001

(65) Prior Publication Data

US 2002/0044031 A1 Apr. 18, 2002

(30) Foreign Application Priority Data

Aug. 31, 2000 (JP) ........................................ 2000-262975

(51) Int. Cl.[7] .............................. H03H 9/64; H03H 9/72
(52) U.S. Cl. ........................ 333/133; 333/193; 333/195
(58) Field of Search ................................. 333/193–196; 310/313 R, 313 B, 313 C, 313 D

(56) References Cited

U.S. PATENT DOCUMENTS

| | | | | |
|---|---|---|---|---|
| 5,521,453 A | * | 5/1996 | Yatsuda | ................... 333/193 X |
| 5,604,393 A | * | 2/1997 | Suzuki et al. | ........... 333/193 X |
| 5,694,096 A | * | 12/1997 | Ushiroku et al. | ........... 333/195 |
| 5,966,060 A | * | 10/1999 | Ikada | ......................... 333/193 |

FOREIGN PATENT DOCUMENTS

| | | |
|---|---|---|
| JP | 5-267990 | 10/1993 |
| JP | 6-260876 | 9/1994 |
| JP | 7-38376 | * 2/1995 |
| JP | 7-66679 | 3/1995 |
| JP | 7-307641 | 11/1995 |
| JP | 8-265087 | 10/1996 |
| JP | 9-8599 | 1/1997 |
| JP | 9-162695 | 6/1997 |
| JP | 10-65481 | 3/1998 |
| JP | 10-107574 | * 4/1998 |
| JP | 10-126212 | 5/1998 |
| JP | 11-068511 | 3/1999 |
| JP | 2000-165198 | 6/2000 |
| JP | 2002-064358 | 2/2002 |
| WO | WO99/04489 | 7/1997 |

* cited by examiner

Primary Examiner—Barbara Summons
(74) Attorney, Agent, or Firm—Keating & Bennett, LLP

(57) ABSTRACT

A surface acoustic wave filter includes a longitudinally-coupled resonator-type surface acoustic wave filter having at least two interdigital transducers disposed on a piezoelectric substrate along the propagation direction of a surface acoustic wave, and at least one surface acoustic wave resonator connected between an input terminal and/or an output terminal and the longitudinally-coupled resonator-type surface acoustic wave filter. In this surface acoustic wave filter, a pass band is formed by utilizing at least one of the resonant modes of the longitudinally-coupled resonator-type surface acoustic wave filter and the inductance of the surface acoustic wave resonator.

22 Claims, 21 Drawing Sheets

SURFACE ACOUSTIC WAVE FILTER WITH A PASSBAND FORMED BY A LONGITUDINALLY COUPLED FILTER AND A RESONATOR INDUCTANCE

BACKGROUND OF THE INVENTION

1. Field of the Invention

The present invention relates to a surface acoustic wave filter preferably used as a band-pass filter in, for example, a communication system, and more particularly, to a surface acoustic wave filter having a surface acoustic wave resonator that is connected to a longitudinally-coupled resonator-type surface acoustic wave filter.

2. Description of the Related Art

In recent years, in portable telephone systems, with the increase in subscribers and the diversification of services, systems in which the transmission-side frequency band and the reception-side frequency band thereof are close to each other, are increasing in number. Depending on the system, it may be necessary to increase the attenuation value in the immediate vicinity of the pass band thereof in order to prevent mutual interference with other communication systems. Hence, in the surface acoustic wave filter widely used as a band-pass filter at the RF stage of a portable telephone, it is strongly desired to provide an attenuation region in the immediate vicinity of the pass band.

On the other hand, in order to reduce the number of components, there have recently been strong demands that two surface acoustic wave filter elements be combined in one package and the input terminals and/or the output terminals thereof be made common, or that the surface acoustic wave filter with a balanced-to-unbalanced conversion function, so-called balun function, be provided. Recently, therefore, longitudinally-coupled resonator-type surface acoustic wave filters which are easily adaptable to achieve balanced-to-unbalanced conversion, have been widely used as band-pass filters at the RF stage of portable telephones.

For example, Japanese Unexamined Patent Application Publication No. 05-267990 discloses a longitudinally connected double mode SAW filter, as an example of such a longitudinally-coupled resonator-type surface acoustic wave filter.

Also, Japanese Unexamined Patent Application Publication No. 10-126212 discloses a filter having a ladder circuit configuration which includes a longitudinally-coupled resonator-type surface acoustic wave filter.

However, the longitudinally-coupled resonator-type surface acoustic wave filter disclosed in the Japanese Unexamined Patent Application Publication No. 05-267990 has a disadvantage in that the steepness of the attenuation-frequency characteristic in the immediate vicinity of the higher frequency side of the pass band is insufficient. This raises a problem in that the attenuation value on the higher frequency side of the pass band, which attenuation value is required in a PCS system or other similar system, cannot be secured, particularly at the immediate vicinity of the pass band.

In contrast, a surface acoustic wave filter disclosed in the Japanese Unexamined Patent Application Publication No. 10-126212 has been able to increase the steepness of the attenuation-frequency characteristic in the immediate vicinity of the higher frequency side of the pass band. However, the ladder type surface acoustic wave filter in the Japanese Unexamined Patent Application Publication No. 10-126212 has not been able to perform a balanced-to-unbalanced conversion function.

That is, although the need for a surface acoustic wave filter which is superior in the steepness of the attenuation-frequency characteristic in the immediate vicinity of the higher frequency side of a pass band, and which has a balanced-to-unbalanced conversion function has been recognized, such a surface acoustic wave filter has not yet been realized.

SUMMARY OF THE INVENTION

In order to overcome the problems with the prior art and to finally satisfy the long felt need for a surface acoustic wave filter which is superior in the steepness of the attenuation-frequency characteristic in the immediate vicinity of the higher frequency side of a pass band, and which has a balanced-to-unbalanced conversion function, preferred embodiments of the present invention to provide a surface acoustic wave filter which exhibits superior steepness of the attenuation-frequency characteristic in the immediate vicinity of the higher frequency side of a pass band, and which is capable of readily performing a balanced-to-unbalanced conversion function.

A surface acoustic wave filter in accordance with a preferred embodiment of the present invention includes a longitudinally-coupled resonator-type surface acoustic wave filter having at least two interdigital transducers disposed on a piezoelectric substrate along the propagation direction of a surface acoustic wave, and at least one surface acoustic wave resonator connected between an input terminal and/or an output terminal and the longitudinally-coupled resonator-type surface acoustic wave filter. In this surface acoustic wave filter, a pass band is formed by utilizing at least one of the resonant modes of the longitudinally-coupled resonator-type surface acoustic wave filter and the inductance of the surface acoustic wave resonator.

In one aspect of the surface acoustic wave filter in accordance with various preferred embodiments of the present invention, the antiresonant frequency of the surface acoustic wave resonator is preferably positioned at a frequency lower than that in the resonant mode positioned on the highest frequency side, among the resonant modes of the longitudinally-coupled resonator-type surface acoustic wave filter.

In another aspect of the surface acoustic wave filter in accordance with various preferred embodiments of the present invention, the resonant frequency of the surface acoustic wave resonator is preferably a frequency that is higher than that in the resonant mode positioned on the highest frequency side, among the resonant modes which constitute the pass band of the longitudinally-coupled resonator-type surface acoustic wave filter.

In still another aspect of the surface acoustic wave filter in accordance with various preferred embodiments of the present invention, the resultant impedance of the surface acoustic wave resonator and the longitudinally-coupled resonator-type surface acoustic wave filter is substantially matched with the impedance in the resonant mode of the longitudinally-coupled resonator-type surface acoustic wave filter.

In a further aspect of the surface acoustic wave filter in accordance with various preferred embodiments of the present invention, the VSWR (voltage standing wave ratio) at the frequency at the attenuation pole generated by the resultant impedance of the surface acoustic wave resonator and the longitudinally-coupled resonator-type surface acoustic wave filter is preferably at least about 3.5.

In a yet further aspect of the surface acoustic wave filter in accordance with various preferred embodiments of the present invention, the surface acoustic wave resonator is subjected to weighting by electrode-finger withdrawal.

In another aspect of various preferred embodiments of the present invention, the surface acoustic wave resonator preferably has a smaller electromechanical coupling coefficient than that of the longitudinally-coupled resonator-type surface acoustic wave filter.

In still another aspect of the surface acoustic wave filter in accordance with various preferred embodiments of the present invention, the surface acoustic wave resonator preferably includes a piezoelectric substrate which has a smaller electromechanical coupling coefficient than that of the longitudinally-coupled resonator-type surface acoustic wave filter.

In a further aspect of the surface acoustic wave filter in accordance with various preferred embodiments of the present invention, at least one inductance element is preferably connected in parallel with the input and/or output terminal to which the surface acoustic wave resonator is connected in series.

In a yet further aspect of the surface acoustic wave filter in accordance with various preferred embodiments of the present invention, there are provided at least two surface acoustic wave filter elements. At least one of the input terminal side and the output terminal side of the at least two surface acoustic wave filter elements is made common, and at least one of the two surface acoustic wave filter elements is constituted of a surface acoustic wave filter in accordance with other preferred embodiments of the present invention described above.

In another aspect of the surface acoustic wave filter in accordance with various preferred embodiments of the present invention, a balanced-to-unbalanced conversion function is provided.

A communication device in accordance with another preferred embodiment of the present invention includes a surface acoustic wave filter in accordance with the other preferred embodiments of the present invention described above.

The above and other elements, features, characteristics and advantages of the present invention will be clear from the following detailed description of preferred embodiments of the invention in conjunction with the accompanying drawings.

BRIEF DESCRIPTION OF THE DRAWINGS

FIGS. 8A and 8B are views explaining resonant modes of a longitudinally-coupled resonator-type surface acoustic wave filter having three IDTs, wherein FIG. 8A is a diagram for showing the attenuation-frequency characteristic of the filter, and FIG. 8B is a schematic view showing the three resonant modes thereof;

DETAILED DESCRIPTION OF PREFERRED EMBODIMENTS

Figure 1:
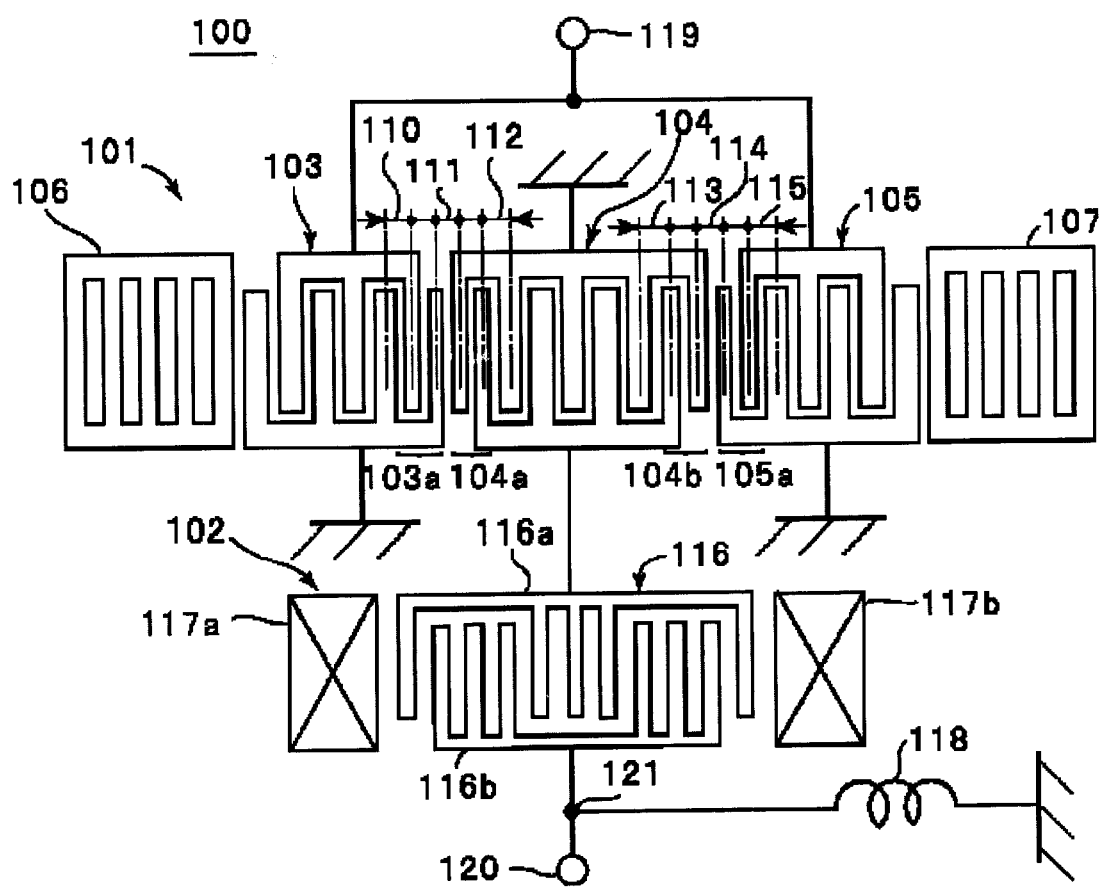
FIG. 1 is a schematic plan view showing the electrode structure of a surface acoustic wave filter in accordance with a first preferred embodiment of the present invention.

FIG. 1 is a schematic plan view showing the electrode structure of a surface acoustic wave filter in accordance with a first preferred embodiment of the present invention. The surface acoustic wave filter in accordance with this preferred embodiment and subsequent preferred embodiments are examples to be applied to transmitting filters for use in PCS systems.

In this preferred embodiment, an illustrated electrode structure constituted of Al is preferably formed on a 40±5°, Y-cut, X-propagation LiTaO$_3$ substrate. Herein, a longitudinally-coupled resonator-type surface acoustic wave filter 101 and a surface acoustic wave resonator 102 connected thereto are constructed of this electrode structure.

In the longitudinally-coupled resonator-type surface acoustic wave filter 101, first to third IDTs 103 to 105 are arranged along the propagation direction of the surface acoustic wave. Reflectors 106 and 107 are preferably disposed outside the IDTs 103 and 105, respectively. One end of each of the IDTs 103 and 105 is connected to an input terminal 119. One end of the IDT 104 is connected to one end of the surface acoustic wave resonator 102. The other end of each of the IDTs 103 to 105 is connected to the ground potential.

Also, in FIG. 1, grating type reflectors 117a and 117b, schematically illustrated, are disposed on opposite sides of the IDT 116 in the surface acoustic wave resonator 102.

The end portion of the surface acoustic wave resonator 102 opposite the side connected to the IDT 104, is connected to an output terminal 120. An inductance element 118 is inserted between the connection point 121, which is between the end portion of surface acoustic wave resonator 102 and the output terminal 120, and the ground potential.

This inductance element 118 is preferably constructed so as to have a value of about 8.2 nH in this preferred embodiment.

The IDTs 103 to 105 are provided with narrow-pitch electrode finger portions each of which has a narrower electrode finger pitch than that of the remaining portion. As can be seen from FIG. 1, in the IDTs 103 to 105, narrow-pitch finger portions 103a, 104a, 104b, and 105a are each located on the sides that are mutually adjacent to the neighboring IDTs. In other words, between mutually adjacent IDTs, narrow-pitch electrode finger portions are provided at the mutually adjacent IDT side-end portions.

More specifically, taking the IDT 103 as an example, the pitch of the electrode finger constituting the narrow-pitch electrode finger portion 103a is narrower than that of the remaining electrode finger portion.

In FIG. 1, the electrode fingers shown are fewer than the actual number in order to simplify the drawing.

Here, specific designs of the surface acoustic wave filter in accordance with this preferred embodiment will be described. In this preferred embodiment, the narrow-pitch electrode finger portions 103a to 105a of the respective IDTs 103 to 105 are preferably all substantially identical to one another. Letting the wavelength of the surface acoustic wave determined by the pitch of these narrow-pitch electrode finger portions be λI2, and the wavelength of the surface acoustic wave determined by the pitch of the other electrode finger portions be λI1, the design of the longitudinally-coupled resonator-type surface acoustic wave filter 101 is preferably as follows:

crossing width W=70.4λI1;
number of electrode fingers of each of the IDTs 103 and 105: number of electrode fingers in a narrow-pitch electrode finger portion=4, and that in the remaining portion=35;
number of electrode fingers of the IDT 104: number of electrode fingers in the narrow-pitch electrode finger portion 104a=4, number of electrode fingers in the narrow-pitch electrode finger portion 104b=4, and number of electrode fingers in the remaining electrode finger portion=55;
λI1=2.13 μm, λI2=1.82 μm;
wavelength of each of the reflectors 106 and 107, λR=2.14 μm;
number of electrode fingers in each of the reflectors=70;
electrode finger intercentral distance between a narrow-pitch electrode finger portion and the remaining electrode finger portion (e.g., the intercentral distances of the portions indicated by the reference numerals 110, 112, 113, and 115 in FIG. 1)=0.25λI1+0.25λI2;
electrode finger intercentral distance between two adjacent IDTs (e.g., the intercentral distances of the portions indicated by the reference numerals 111 and 114 in FIG. 1)=0.50λI2;
IDT-to-reflector distance=0.54λR;
duty of each of the IDTs 103 to 105=0.60;
duty of each of the reflectors=0.60;
Here, "duty" refers to the ratio of the width of electrode fingers with respect to (the width of electrode fingers+ the width of gaps among electrode fingers).
film thickness of electrode=0.08λI1;
Next, the design of the surface acoustic wave resonator 102 is preferably as follows:
crossing width W=34.1λ;
Here, λ denotes the wavelength of the surface acoustic wave determined by the electrode finger pitch of the surface acoustic wave resonator.
number of electrode fingers in the IDT 116=301;
=2.05 μm;
number of electrode fingers in each of the reflectors=30;
IDT-to-reflector distance=0.50λ;
duty of the IDT and each of the reflectors=0.60;
film thickness of electrode=0.083λ;
In the surface acoustic wave resonator 102, the IDT 116 is weighted by electrode-finger withdrawal, in order to reduce the distance between the resonant frequency and the antiresonant frequency.

The IDT 116 has comb electrodes 116a and 116b. By expressing the sign of an electrode finger on the comb electrode 116a side as "+" and expressing that of an electrode finger on the comb electrode 116b as "−", a state of weighting by electrode-finger withdrawal is expressed. Here, let the arrangement of neighboring two electrode fingers wherein a "+" electrode finger and a "−" electrode finger are successively arranged along the direction from the left side to the right side in FIG. 1, be expressed as "+1"; let the arrangement wherein a "−" electrode finger and a "+" electrode finger are consecutively arranged, be expressed as "−1"; and let the arrangement wherein a "+" electrode finger is arranged in the next place of a "+" electrode finger, or wherein a "−" electrode finger is arranged in the next place of a "−" electrode finger, be expressed as "0". Then, the IDT 116 is subjected to weighting by electrode-finger withdrawal in a manner such that the arrangement the electrode fingers is expressed as "1, 0, 0, −1, 0, 0, 1, 0, 0, −1, . . . −1, 0, 0, 1, 0, 0, −1, 0, 0, 1". Meanwhile, in FIG. 1, the IDT 116 is depicted so as having a fewer number of electrode fingers than the actual case in order to simplify the drawing.

Figure 2:
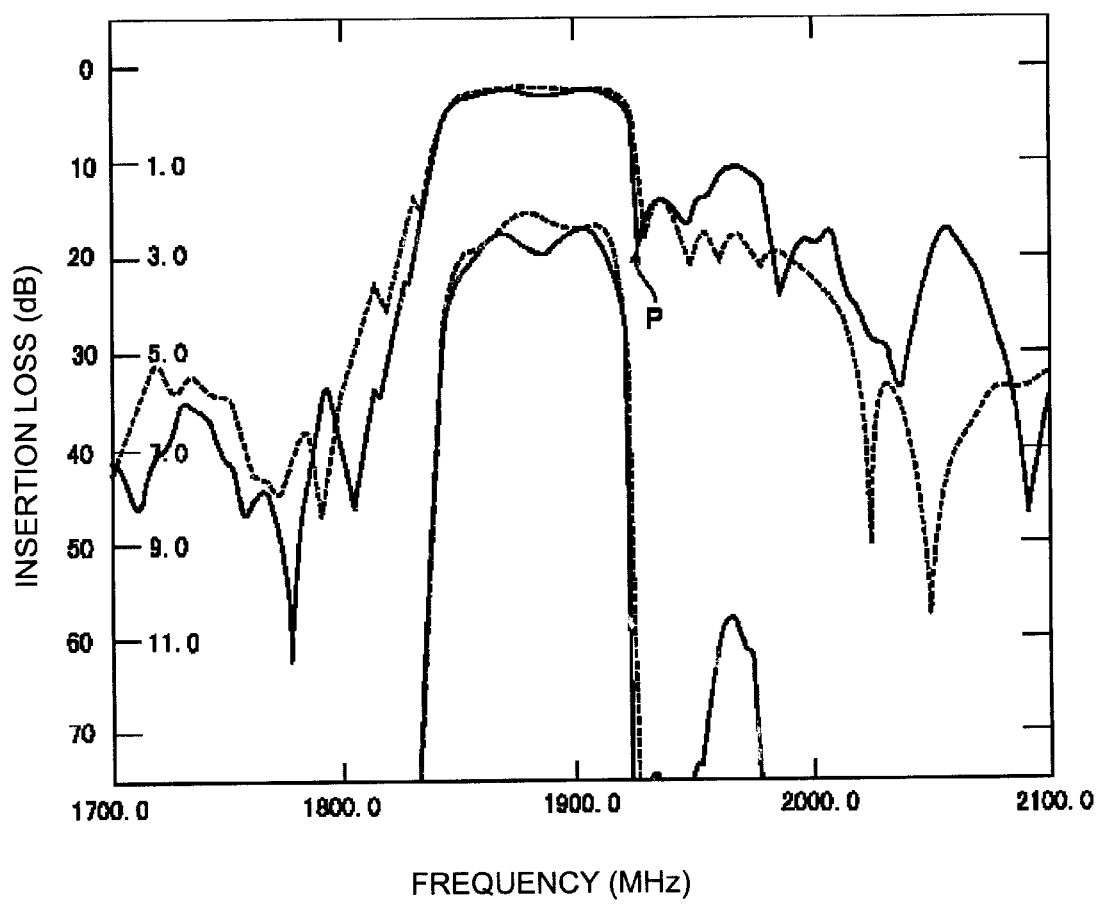
FIG. 2 is a diagram showing the attenuation-frequency characteristic of the surface acoustic wave filter in accordance with the first preferred embodiment and a conventional example.
Figure 3:
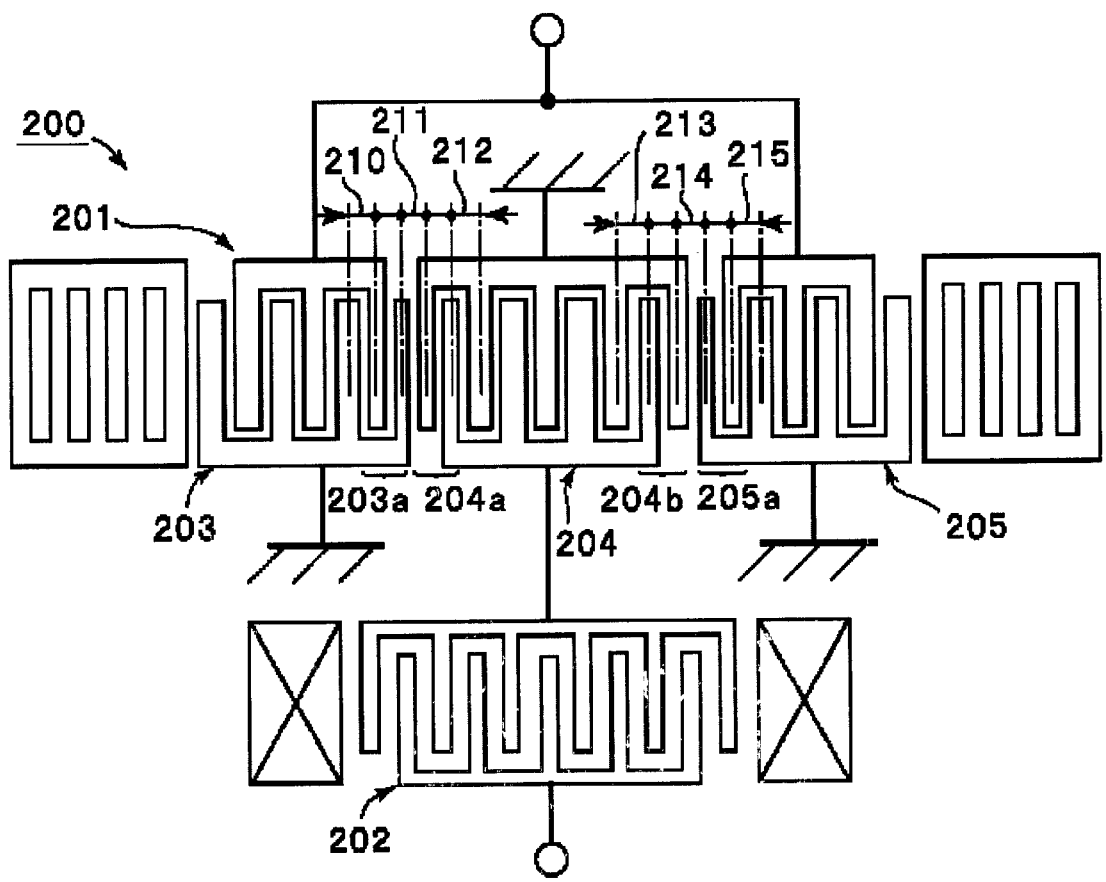
FIG. 3 is a schematic plan view showing the electrode structure of a conventional surface acoustic wave filter prepared for comparison to preferred embodiments of the present invention.

The attenuation-frequency characteristic of the surface acoustic wave filter 100 in accordance with this preferred embodiment are represented by a solid line in FIG. 2. For comparison, the attenuation-frequency characteristic of the conventional surface acoustic wave filter shown in FIG. 3 are represented by a broken line in FIG. 2. In Fig. 2, the critical portion of the attenuation-frequency characteristic is additionally illustrated, by an enlarged scale on the right side of the vertical axis.

As in the case of the surface acoustic wave filter 100 in accordance with the first preferred embodiment, the surface acoustic wave filter 200 has a configuration wherein a longitudinally-coupled resonator-type surface acoustic wave filter 201 and a surface acoustic wave resonator 202 are preferably disposed on a 40±5°, Y-cut, X-propagation LiTaO$_3$ substrate, by an Al electrode structure. Also, as is the case with the surface acoustic wave filter 100, in the longitudinally-coupled resonator-type surface acoustic wave filter 201, IDTs 203 to 205 are successively arranged along the propagation direction of the surface acoustic wave, and narrow-pitch electrode finger portions 203a, 204a, 204b, and 205a are each provided in the IDTs 203 to 205 at the mutually adjacent IDT side end portions. The detailed design of this longitudinally-coupled resonator-type surface acoustic wave filter 201 will be described below. Herein also, the wavelength determined by the pitch of the narrow-pitch electrode finger portions is λI2, and that determined by the pitch of the other electrode finger portions is λI1.

crossing width W=66.0λI1;

number of electrode fingers of each of the IDTs 203 and 205: number of electrode fingers in each of the narrow-pitch electrode finger portions 203a and 205a=4, and that in each of the remaining portions thereof=27;

number of electrode fingers of the IDT 204: number of electrode fingers in the narrow-pitch electrode finger portion 204a =4, number of electrode fingers in the narrow-pitch electrode finger portion 204b=4, and number of electrode fingers in the remaining electrode finger portion thereof=33;

λI1=2.12 μm, λI2=1.94 μm;

wavelength of each of the reflectors 206 and 207, λR=2.14 μm;

number of electrode fingers in each of the reflectors 206 and 207=60;

electrode finger center-to-center distance at the portion sandwiched by the electrode finger having a wavelength of λI1 and that having a wavelength of λI2 (e.g., the center-to-center distances of the portions indicated by the reference numerals 210, 212, 213, and 215 in FIG. 3)=0.25λI1 ±0.25λI2;

IDT-to-IDT distance (the intercentral distances of the portions indicated by the reference numerals 211 and 214 in FIG. 3)=0.50λI2;

IDT-to-reflector distance=0.50λR;

duty of each of the IDTs and each of reflectors=0.60;

film thickness of electrode finger=0.080λI1;

Next, the detailed design of the surface acoustic wave resonator 202 is preferably as follows:

crossing width W=33.2λ;

number of electrode fingers in IDT=341;

wavelength of IDT and each of the reflectors, λ=2.11 μm;

number of electrode fingers in each of the reflectors=30;

IDT-to-reflector distance=0.50λ;

duty of each of the IDTs and each of reflectors=0.60;

film thickness of electrode finger=0.080λ;

The surface acoustic wave filter 200 shown in FIG. 3 is constructed, for example, in accordance with Japanese Unexamined Patent Application Publication No. 07-66679.

As can be seen from FIG. 2, the surface acoustic wave filter 100 in accordance with the first preferred embodiment has a greater steepness of the attenuation-frequency characteristic in the immediate vicinity of the higher frequency side of the pass band than that of the above-described conventional surface acoustic wave filter 200. For example, when the frequency widths required for the insertion losses to extend from the position of about 4.5 dB to the position of about 10 dB, each from the through level, are compared between the first preferred embodiment and the conventional example, the frequency width is about 3.4 MHz for the first preferred embodiment in contrast to 5.6 MHz for the conventional example. That is, the first preferred embodiment exhibits a frequency width lower by about 2.2 MHz than that of the conventional example.

Figure 4:
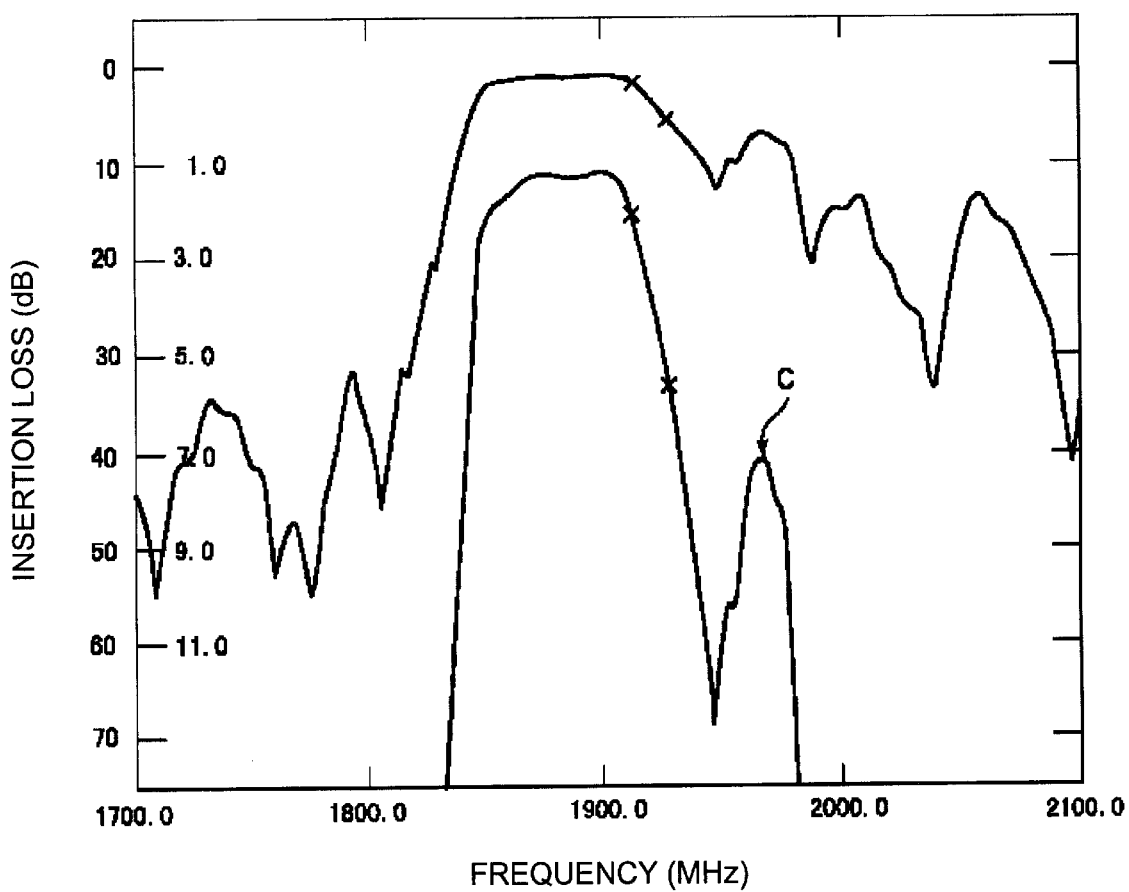
FIG. 4 is a diagram showing the attenuation-frequency characteristic of the longitudinally-coupled resonator-type surface acoustic wave filter included in the first preferred embodiment.
Figure 5:
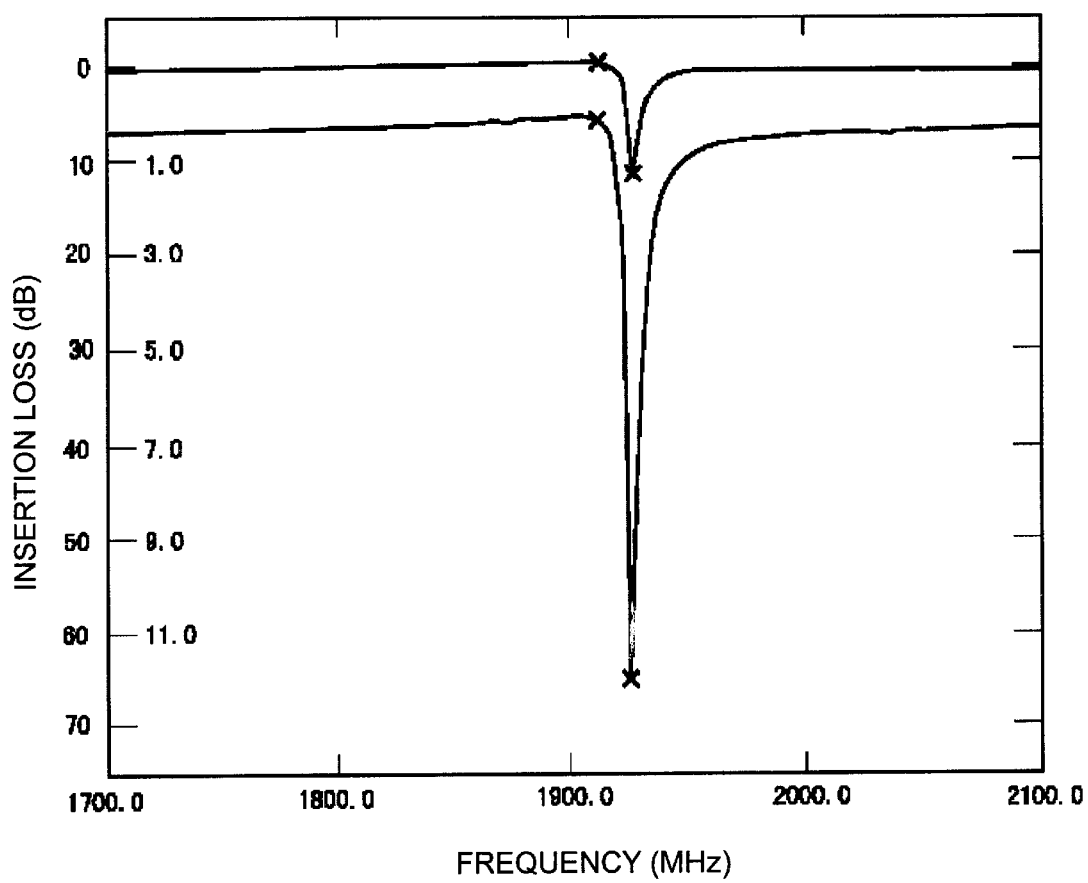
FIG. 5 is a diagram showing the attenuation-frequency characteristic of the surface acoustic wave resonator included in the first preferred embodiment.
Figure 6:
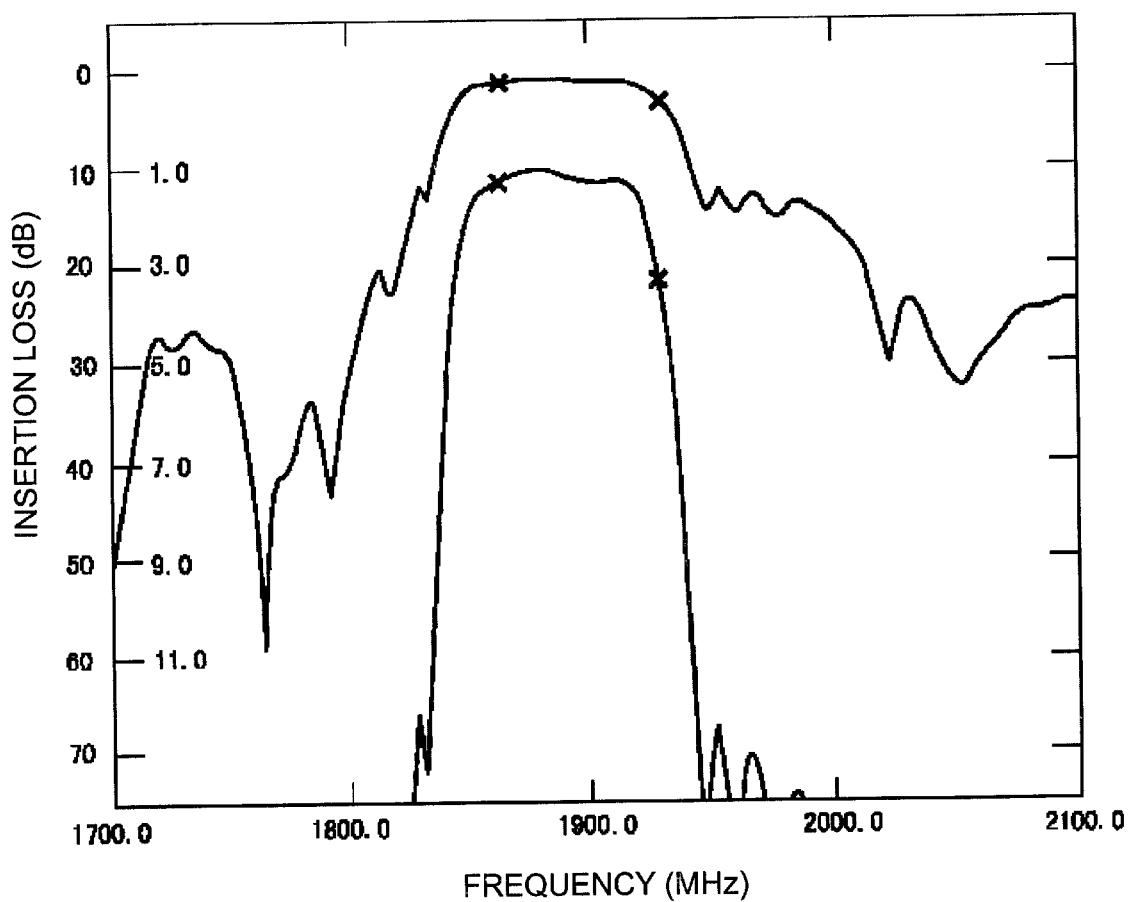
FIG. 6 is a diagram showing the attenuation-frequency characteristic of the longitudinally-coupled resonator-type surface acoustic wave filter included in the surface acoustic wave filter in accordance with the conventional example.
Figure 7:
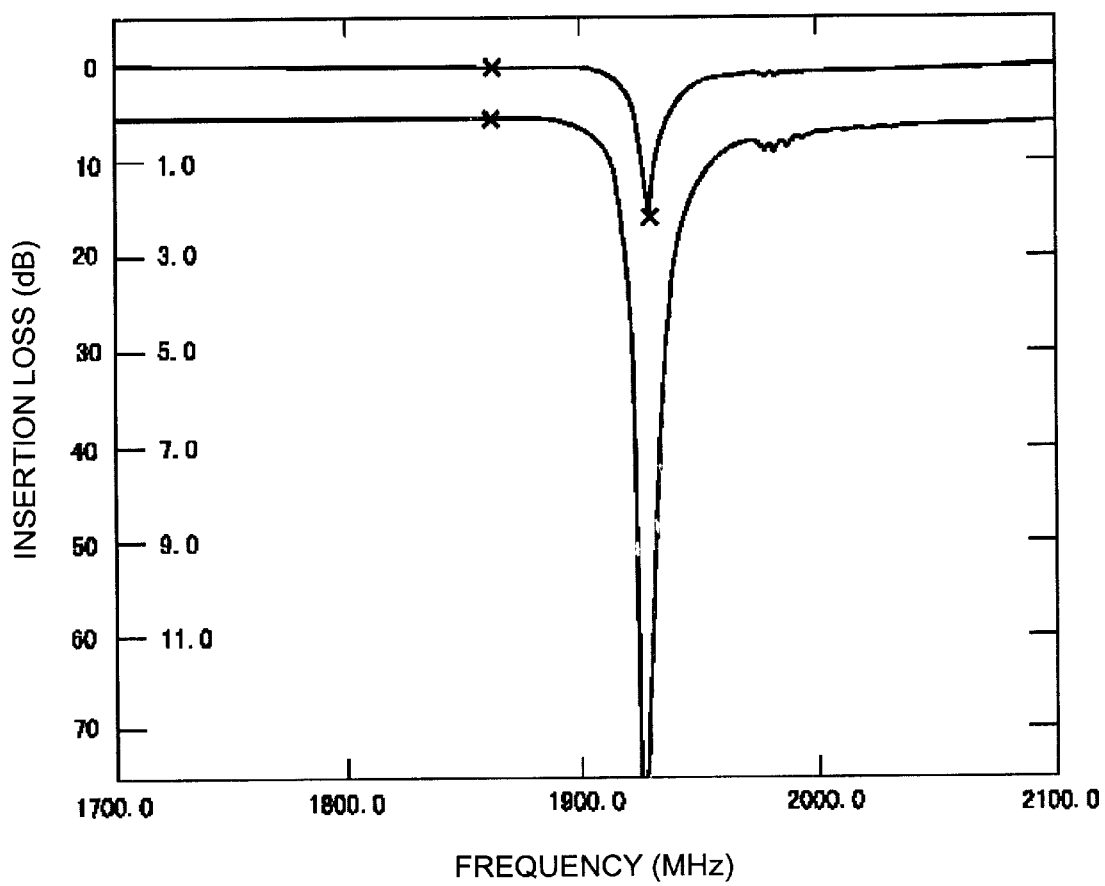
FIG. 7 is a diagram showing the attenuation-frequency characteristic of the surface acoustic wave resonator included in the surface acoustic wave filter in accordance with the conventional example.

Next, the principles of the present invention will be described on the basis of this preferred embodiment of the present invention. FIG. 4 shows the attenuation-frequency characteristic of the longitudinally-coupled resonator-type surface acoustic wave filter 101 used in the first preferred embodiment, and FIG. 5 shows that of the surface acoustic wave resonator 102. On the other hand, FIG. 6 illustrates the attenuation-frequency characteristic of the longitudinally-coupled resonator-type surface acoustic wave filter 201 used in the above-described conventional example, and FIG. 7 illustrates that of the surface acoustic wave resonator 202.

The marks "x" in FIGS. 4 and 5 each indicate the positions of the resonant frequency and the antiresonant frequency of the surface acoustic wave resonator 102. Herein, the mark "x" on the lower frequency side indicates the position of the resonant frequency, while that on the higher frequency side indicates the position of the antiresonant frequency. On the other hand, the marks "x" in FIGS. 6 and 7 each indicate the positions of the resonant frequency and the antiresonant frequency of the surface acoustic wave resonator 202. Herein also, the mark "x" on the lower frequency side indicates the position of the resonant frequency, but on the higher frequency side indicates the position of the antiresonant frequency.

Figure 8A:
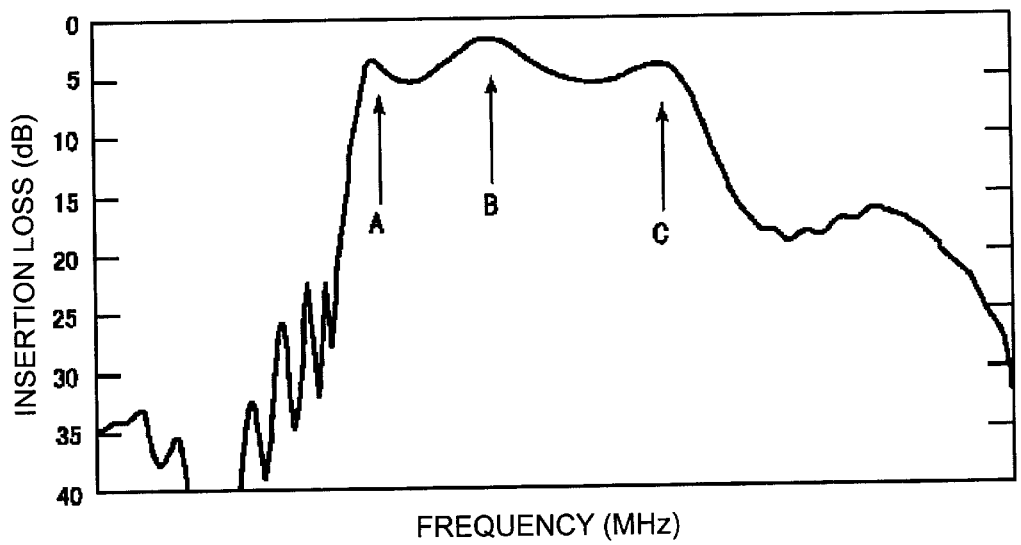
Figure 8B:
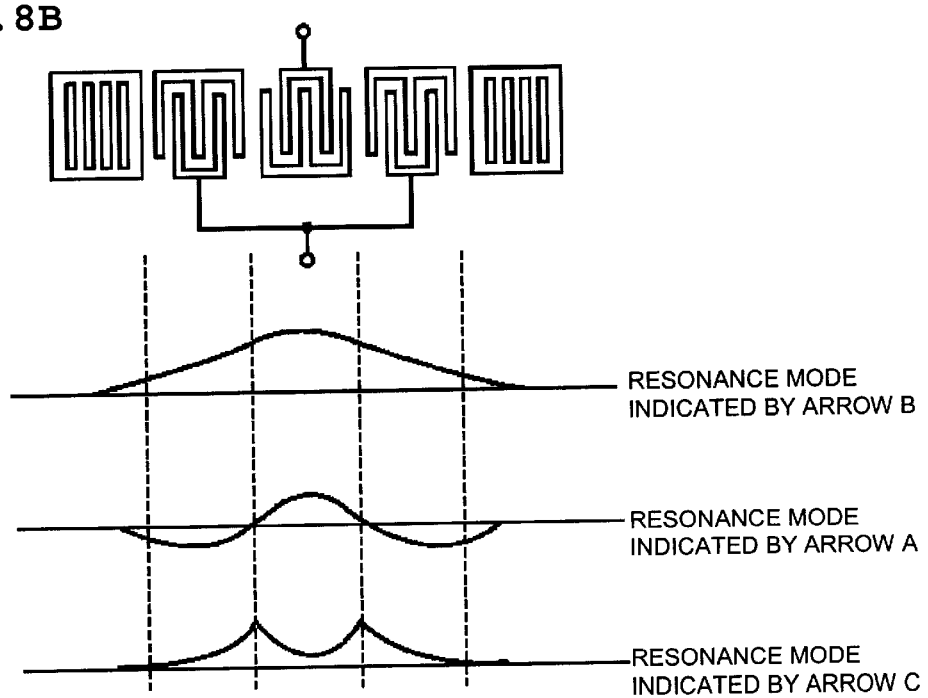

As shown in FIGS. 8A and 8B, in a longitudinally-coupled resonator-type surface acoustic wave filter having three IDTs, a pass band is preferably formed using three modes: a zeroth-order mode (the resonant mode indicated by the arrow B), a second-order mode (the resonant mode indicated by the arrow A), and a mode having the peak of intensity distribution of a surface acoustic wave at an IDT-to-IDT distance portion (the resonant mode indicated by the arrow C).

The steepness of the attenuation-frequency characteristic in the immediate vicinity of the higher frequency side of the pass band is determined by the resonant mode indicated by the arrow C among the above-described three resonant modes. However, sufficient steepness of the attenuation-frequency characteristic cannot be achieved in the immediate vicinity of the higher frequency side of the pass band merely by the steepness of the attenuation-frequency characteristic based on the above-described resonant mode indicated by the arrow C.

Accordingly, the steepness of the attenuation-frequency characteristic in the immediate vicinity of the higher frequency side of the pass band has been previously realized by designing the pass band width of the longitudinally-coupled resonator-type surface acoustic wave filter to be greater than that of a required bandwidth, by matching the antiresonant frequency of the surface acoustic wave resonator connected to the longitudinally-coupled resonator-type surface acoustic wave filter with the frequency on the higher frequency side of the pass band, and by utilizing the steepness of the attenuation-frequency characteristic.

In contrast, in the first preferred embodiment, as can be seen from FIG. 4, the pass band width of the longitudinally-coupled resonator-type surface acoustic wave filter 101 is narrower than the pass band width (shown in FIG. 2) in the case where the surface acoustic wave resonator is connected in series. That is, unlike the above-described conventional example, the longitudinally-coupled resonator-type surface acoustic wave filter 101 becomes wider in the pass band width by the serial connection of the surface acoustic wave resonator 102 to the longitudinally-coupled resonator-type surface acoustic wave filter 101. This will be described using the reflection characteristic, that is, the reflection characteristic on the S22 side to which the surface acoustic wave resonator is connected in series.

Figure 9A:
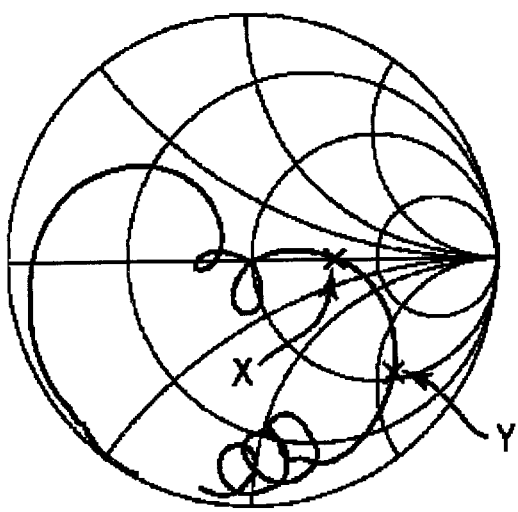
FIGS. 9A to 9D are each diagrams explaining the principle of preferred embodiments of the present invention using the reflection characteristic S22.
Figure 9B:
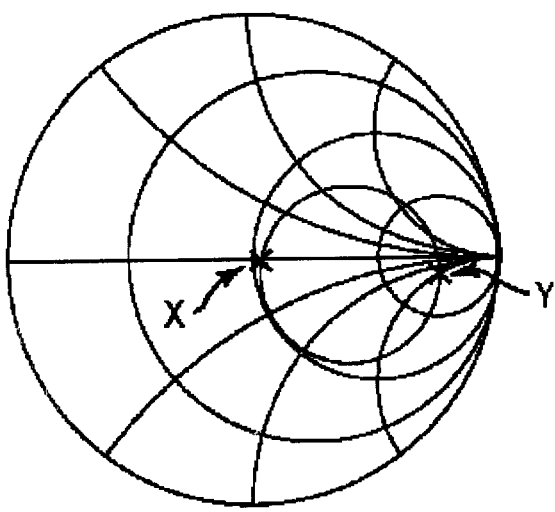
Figure 9C:
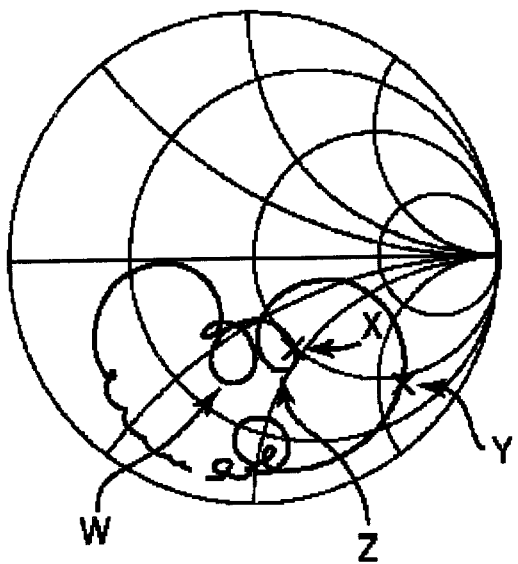
Figure 9D:
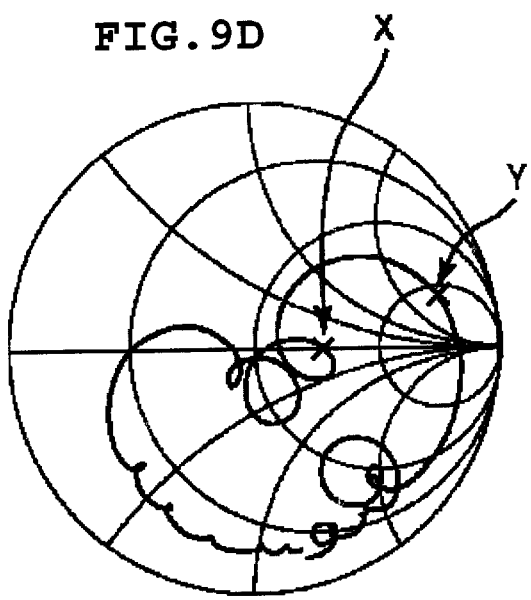

FIG. 9A shows the reflection characteristic of the longitudinally-coupled resonator-type surface acoustic wave filter 101, and FIG. 9B shows the reflection characteristic of the surface acoustic wave resonator 102. The reflection characteristic of the surface acoustic wave filter in accordance with the first preferred embodiment is the composite characteristic of these two reflection characteristic, as shown in FIG. 9C.

In FIG. 9, the marker indicated by the arrow X denotes the resonant frequency (=1909.5 MHz) of the surface acoustic wave resonator 102, and the one indicated by the arrow Y denotes the antiresonant frequency (=1925 MHz) thereof.

In the frequency region between the resonant frequency and the antiresonant frequency of the longitudinally-coupled resonator-type surface acoustic wave filter 101, the impedance is capacitive(i.e., the region in the lower half in the Smith chart). In contrast, in the frequency region between the resonant frequency and the anti-resonant frequency of the surface acoustic wave resonator 102, the impedance is inductive (i.e., the region in the upper half in the Smith chart). Therefore, this frequency region of the longitudinally-coupled resonator-type surface acoustic wave filter 101 is pulled by the inductive region. As a result, as shown in FIG. 9C, a resonant mode Z occurs under the influence of the inductance of the surface acoustic wave resonator. By substantially matching the impedance of the resonant mode Z with impedances of the other resonant modes of the longitudinally-coupled resonator-type surface acoustic wave filter 101, as illustrated, the pass band width is greatly widened. However, it is considered that the resonant mode Z is different from the resonant mode generated by the intensity distribution of the surface acoustic wave, and is due to an LC resonance. The resonant mode Z is created by making the resonant frequency of the surface acoustic wave resonator 102 higher than the frequency in the resonant mode (the mode indicated by the arrow W in FIG. 9C) situated on the highest frequency side of the resonant modes forming the pass bands of the longitudinally-coupled resonator-type surface acoustic wave filter 101.

That is, the longitudinally-coupled resonator-type surface acoustic wave filter 101 has a capacitive impedance at a frequency region, and the surface acoustic wave element has an inductive impedance at the frequency region, so that a new resonance is generated by an LC resonation.

By forming a pass band through the above-described method, the steepness of the frequency characteristic of the surface acoustic wave resonator is utilized as a steepness of the frequency characteristic of the filter, substantially as it is. In the above-described conventional example also, the steepness of the frequency characteristic in the overall filter is enhanced making use of the steepness of the frequency characteristic of the surface acoustic wave resonator, but the steepness of the frequency characteristic of the surface acoustic wave resonator has not been able to be utilized as it is, since the steepness of the frequency characteristic of the resonant mode at the highest frequency side also exerts its influence.

In contrast, as in the described first preferred embodiment of the present invention, the unnecessary resonant mode on the highest frequency side is disposed outside the pass band, as indicated by the arrow C in FIG. 4. Hence, the influence of the resonant mode C, which, in the conventional example, has constituted a factor which deteriorates the steepness of the filter characteristic in the immediate vicinity of the higher frequency side of the pass band, does not occur in this preferred embodiment, so that the steepness of the filter characteristic of the surface acoustic wave resonator can be utilized as it is to increase the steepness of the filter characteristic of the filter. This allows the steepness of the filter characteristic in the immediate vicinity of the higher frequency side of the pass band of the filter to be even more improved.

Figure 10:
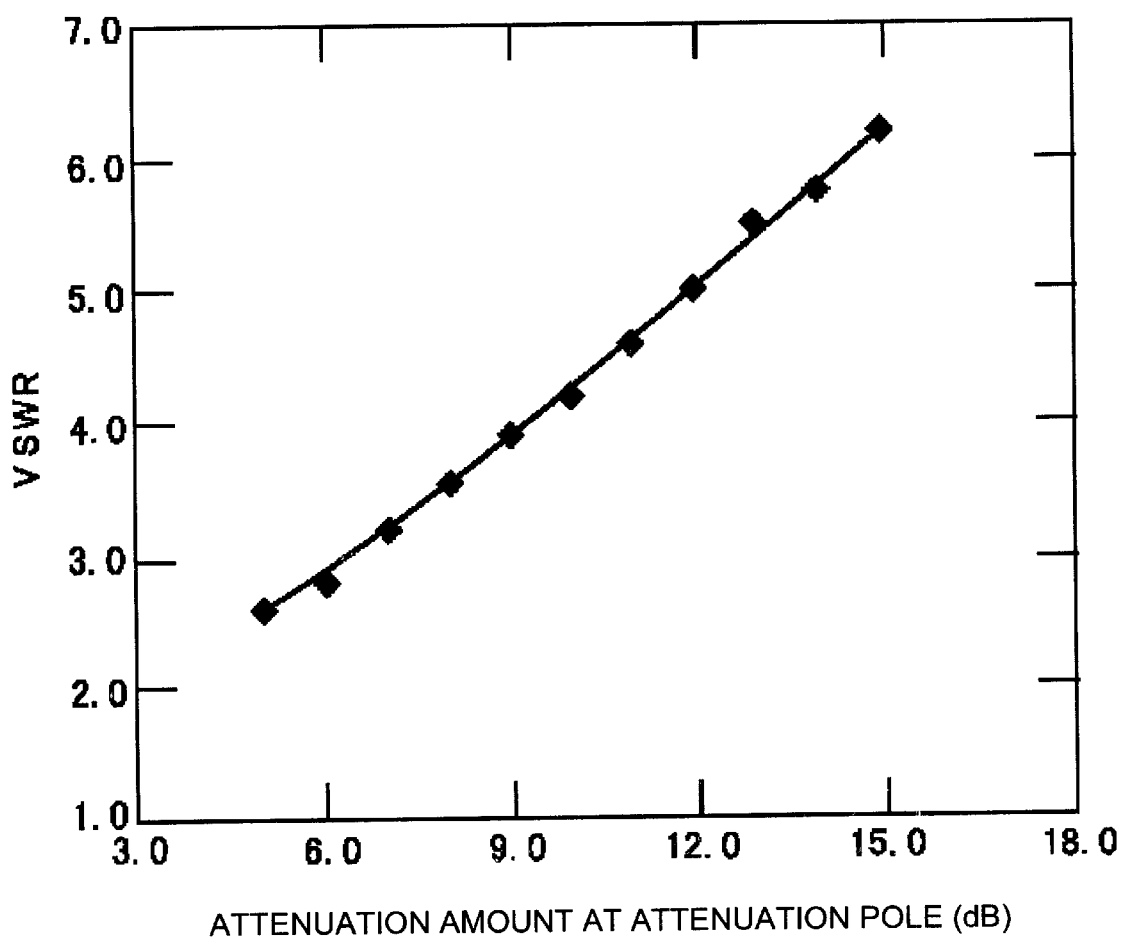
FIG. 10 is a diagram showing the relationship between the attenuation value (shown in FIG. 2) at the attenuation pole P and VSWR.

Necessary conditions for obtaining a sufficient level of the attenuation value in the immediate vicinity of the higher frequency side of the pass band in various preferred embodiments of the present invention have been investigated. In preferred embodiments of the present invention, the attenuation value in the immediate vicinity of the higher frequency side of the pass band is determined by the attenuation value at the attenuation pole (i.e., the attenuation pole indicated by the arrow P in FIG. 2) generated by the resultant impedance of the longitudinally-coupled resonator-type surface acoustic wave filter and the surface acoustic wave resonator. The attenuation value at this attenuation pole P is determined by the impedance at the attenuation pole P. In other words, the attenuation value at this attenuation pole P is determined by the amount by which the impedance at the attenuation pole deviates from the matching condition, or, it is determined by the value of the VSWR. Accordingly, the VSWR value at the attenuation pole P with respect to the attenuation value at the attenuation pole P has been investigated by varying the capacitance of the surface acoustic wave resonator 102 of the surface acoustic wave filter in accordance with the first preferred embodiment of the present invention. FIG. 10 shows the results.

The surface acoustic wave filter 100 for use, for example, in PCS reception included in the first preferred embodiment, requires at least about 8 dB as an attenuation value in the immediate vicinity of the higher frequency side of the pass band, and other systems also require substantially the same level of attenuation. As can be seen from FIG. 10, the VSWR at the attenuation pole when the attenuation value at the attenuation pole is at least about 8 dB, is about 3.5. This shows that the VSWR value of about 3.5 or above allows a sufficient attenuation to be provided.

As shown in FIGS. 8A and 8B, in the present preferred embodiment, the steepness of the filter characteristic is increased by arranging a plurality of resonant modes. In order to thus arrange a plurality of resonant modes, there are various methods to be adopted. In the first preferred embodiment, a method in which the pitch of the narrow-pitch finger portion is adjusted, is used. As is evident from the comparison with the conventional example, in the surface acoustic wave filter in accordance with the first preferred embodiment, the ratio of the electrode finger pitch in the narrow-pitch electrode finger portion with respect to the electrode finger pitch in the electrode finger portion other than the narrow-pitch electrode finger portion in the longitudinally-coupled resonator-type surface acoustic wave filter 101, is preferably small. Specifically, this ratio is about 0.854 for the first preferred embodiment in contrast to about 0.915 for the conventional example. Setting this ratio to about 0.90 or below allows a resonant mode disposition that is effective for increasing the steepness in the filter characteristic to be realized.

Furthermore, an effective resonant mode disposition can also be implemented by the method in which the center-to-center distances of the electrode fingers 110 to 115 shown in FIG. 1 are adjusted. Moreover, in a surface acoustic wave filter without narrow-pitch electrode fingers, for example, the surface acoustic wave filter disclosed in Japan Unexamined Patent Application Publication No. 05-267990, letting the wavelength of a surface acoustic wave be λI, the above-described effective resonant mode disposition can be realized by setting the IDT-to-IDT distance to be (0.28+0.5n)λI to (0.40+0.5 n)λI (here, "n" is zero or an integer), although the IDT-to-IDT distance is typically set to be about (0.25+0.5n)λI.

In preferred embodiments of the present invention, it is desirable that the distance between the resonant frequency and the antiresonant frequency of the surface acoustic wave resonator serially connected to the longitudinally-coupled resonator-type surface acoustic wave filter be narrow. The steepness of the filter characteristic of the surface acoustic wave resonator is determined by the distance between these frequencies. Therefore, the steepness of the frequency characteristic in the immediate vicinity of the higher frequency side of the pass band of the overall surface acoustic wave filter also depends on the above-described frequency distance. In the first preferred embodiment of the present invention, the frequency distance is reduced by performing weighting by electrode-finger withdrawal for the surface acoustic wave resonator 102. Since the impedance of the surface acoustic wave resonator 102 is increased by the weighting by electrode-finger withdrawal, the impedance in the pass band becomes capacitive, as shown in FIG. 9C. In order to correct this, in the first preferred embodiment, an inductance element 118 is connected in parallel, thereby achieving impedance matching (this allows the reflection characteristic shown in FIG. 9D to be realized).

The method for achieving impedance matching is not limited to the method in which the above-described inductance element 118 is inserted, but impedance matching may be performed by using, for example, another inductance or a combination of an inductance and a capacitance.

Figure 11:
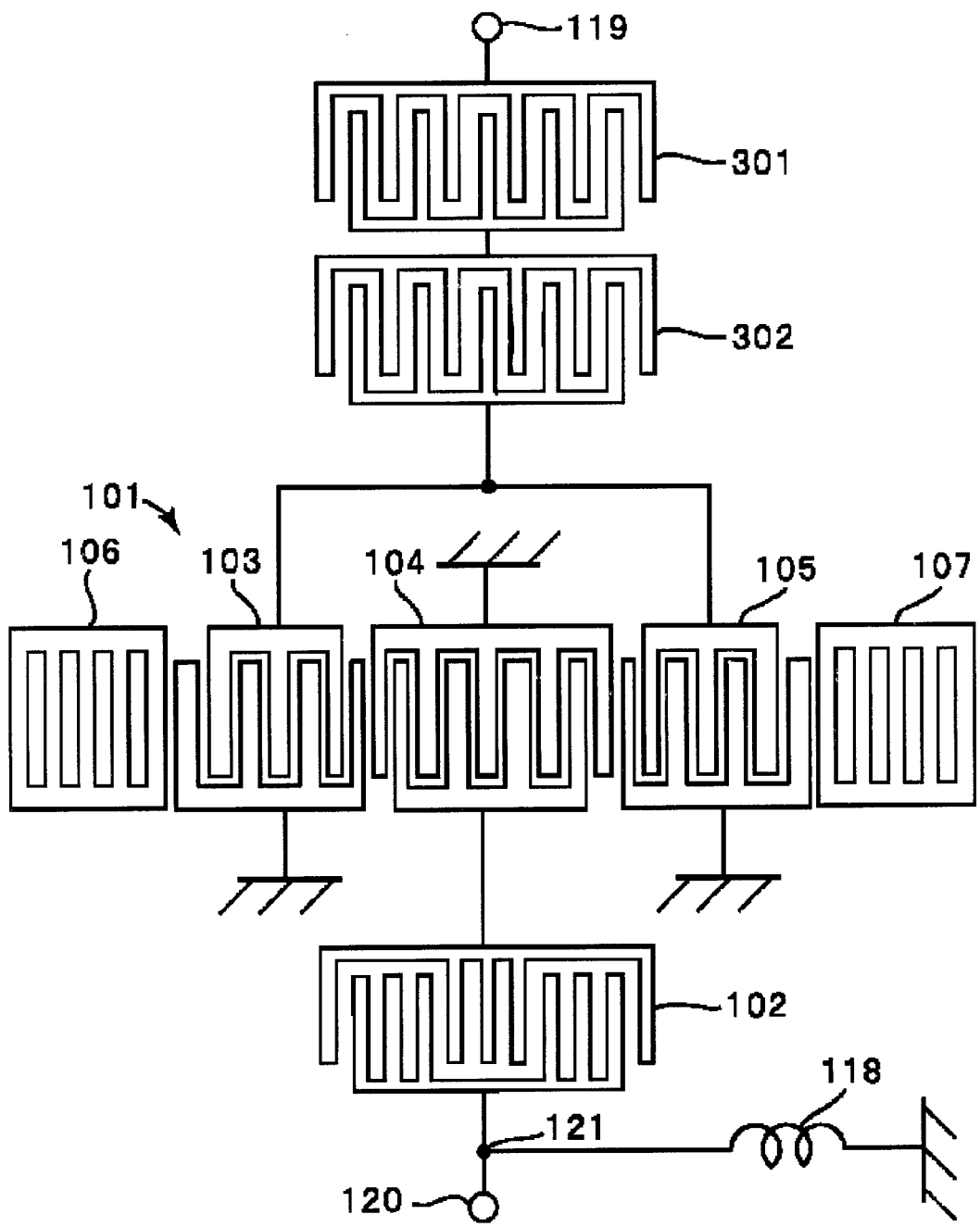
FIG. 11 is a schematic plan view explaining a surface acoustic wave filter in accordance with a modification of the first preferred embodiment of the present invention.
Figure 12:
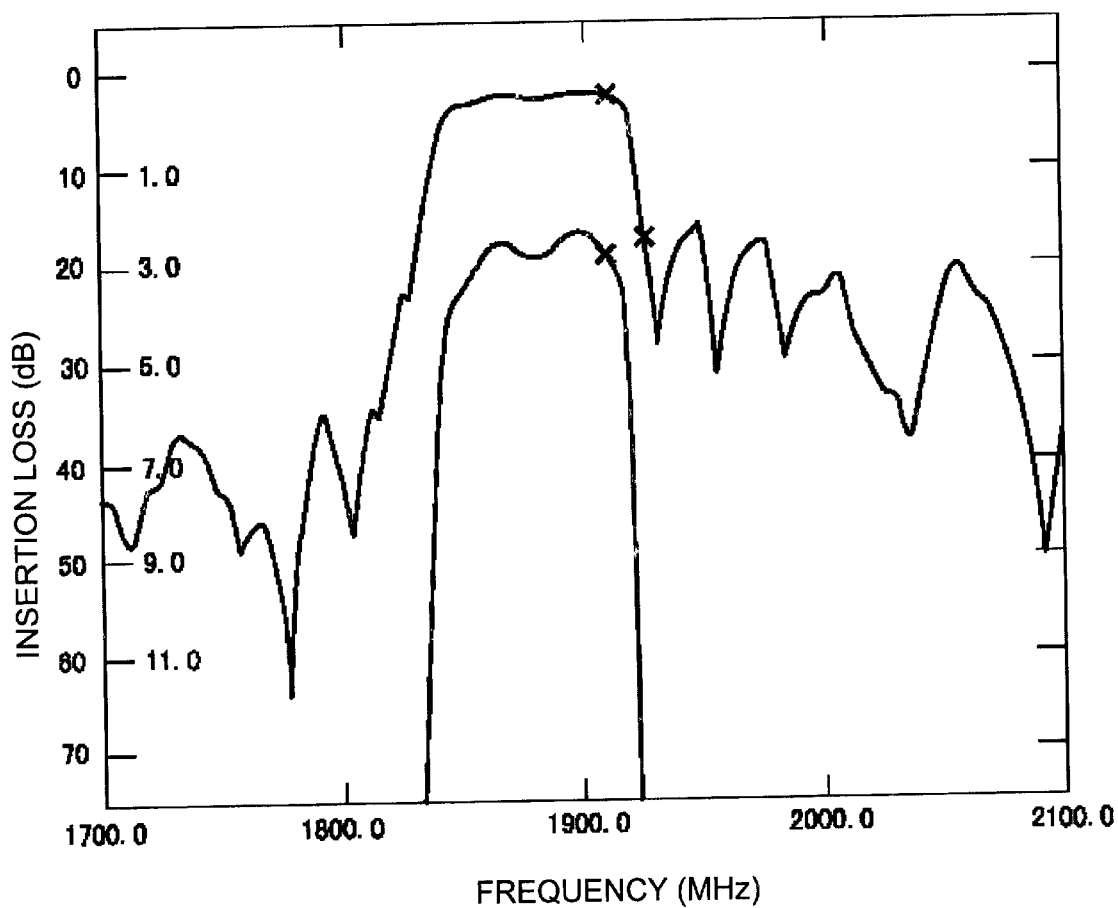
FIG. 12 is a diagram showing the attenuation-frequency characteristic of the modification shown in FIG. 11.

In the first preferred embodiment, the steepness of the attenuation-frequency characteristic in the immediate vicinity of the higher frequency side of the pass band is improved, but the attenuation value in the frequency region slightly apart from the above-described frequency toward the higher frequency side is less sufficient than that of the conventional example. In order to improve this, therefore, it is preferable that surface acoustic wave resonators 301 and 302 be connected in series between the input terminal 119 and the longitudinally-coupled resonator-type surface acoustic wave filter 101, as shown in FIG. 11. FIG. 12 shows the frequency characteristic of the modification shown in FIG. 11. The detailed designs of the surface acoustic wave resonators 301 and 302 are shown in Table 1 below.

TABLE 1

|  | 301 | 302 |
|---|---|---|
| CROSSING WIDTH | 38.6λ | 38.1λ |
| NUMBER OF ELECTRODE FINGERS IN IDT | 201 | 301 |
| WAVELENGTH λ (IDT, REFLECTOR) | 2.07 μm | 2.10 μm |
| IDT-TO-REFLECTOR DISTANCE | 0.50λ | 0.50λ |
| NUMBER OF ELECTRODE FINGERS IN REFLECTOR | 30 | 30 |
| DUTY (IDT, REFLECTOR) | 0.60 | 0.60 |
| FILM THICKNESS OF ELECTRODE | 0.082λ | 0.081λ |

Also, without adding the surface acoustic wave resonators 301 and 302, the attenuation value in the frequency region slightly apart from the higher frequency side of the pass band toward the higher frequency side, may be increased by performing weighting by electrode-finger withdrawal for the IDTs 103 to 105 of the longitudinally-coupled resonator-type surface acoustic wave filter 101.

Figure 13:
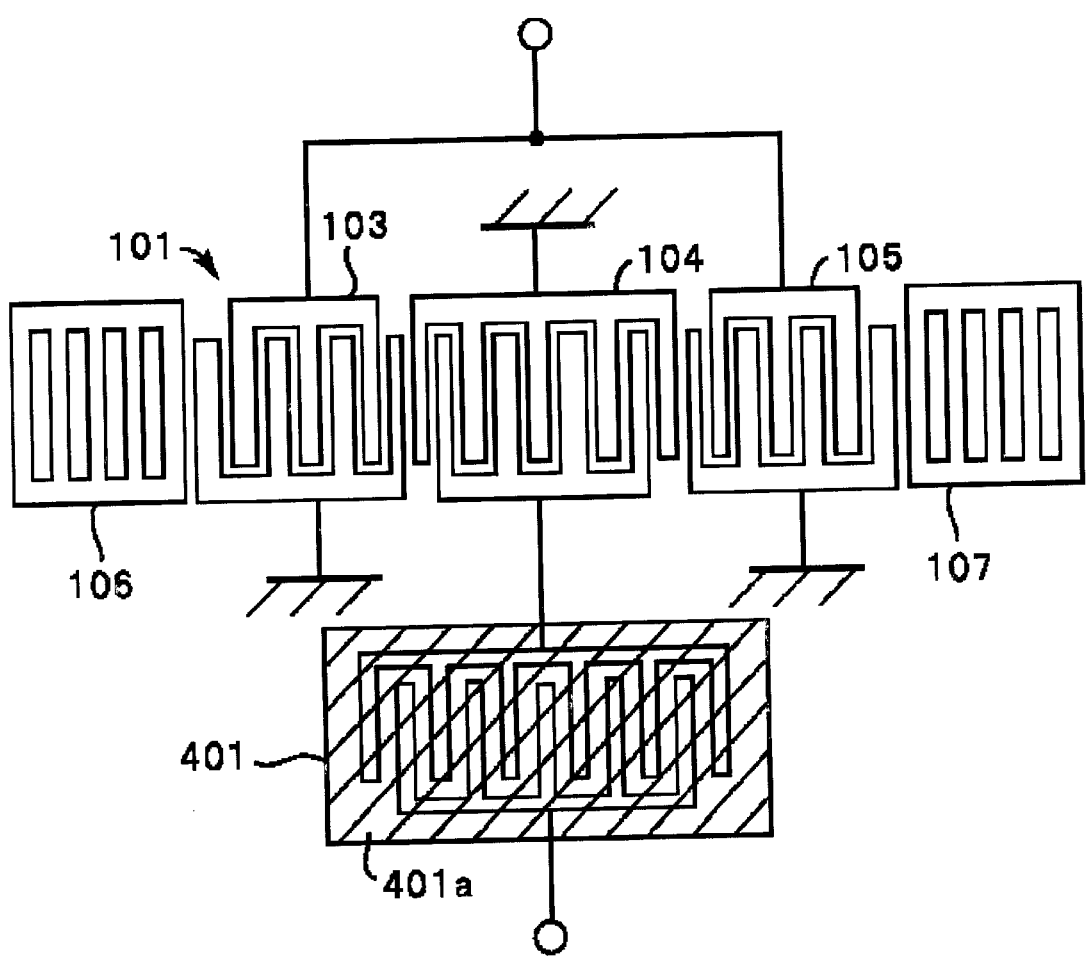
FIG. 13 is a schematic plan view showing the electrode structure of a surface acoustic wave filter in accordance with a second preferred embodiment of the present invention.

In the first preferred embodiment of the present invention, the frequency distance between the resonant frequency and the antiresonant frequency of the surface acoustic wave resonator 102 serially connected to the longitudinally-coupled resonator-type surface acoustic wave filter has been reduced by the weighting by electrode-finger withdrawal. On the other hand, in a second preferred embodiment of the present invention, the above-described frequency distance is reduced by decreasing the electromechanical coupling coefficient of the surface acoustic wave resonator instead of weighting by electrode-finger withdrawal. FIG. 13 is a schematic plan view showing the electrode structure of a surface acoustic wave filter in accordance with the second preferred embodiment of the present invention.

In the surface acoustic wave filter in accordance with the second preferred embodiment of the present invention, a surface acoustic wave resonator 401 is connected in series with a longitudinally-coupled resonator-type surface acoustic wave filter 101. The longitudinally-coupled resonator-type surface acoustic wave filter 101 is preferably constructed in a similar manner to the first preferred embodiment. Over the surface acoustic wave resonator 401, $SiO_2$ films are laminated, as indicated by hatching. In the second preferred embodiment, on the piezoelectric substrate, the $SiO_2$ films 401a are laminated preferably only at the portion where the surface acoustic wave resonator 401 is located. By these $SiO_2$ films 401a, the electromechanical coupling coefficient of the surface acoustic wave resonator 401 is reduced, and thereby the frequency distance between the resonant frequency and the antiresonant frequency is reduced.

In the second preferred embodiment of the present invention, the electromechanical coupling coefficient of the surface acoustic wave resonator 401 is reduced by laminating the $SiO_2$ films 401a over the surface acoustic wave resonator 401. Apart from the $SiO_2$ films, however, dielectric films or insulating films constituted of aluminum oxide, magnesium oxide, tantalum oxide, titanium oxide, niobium oxide, silicon nitride, silicon oxide nitride, or other suitable material may be used as laminated films.

Furthermore, in order to reduce only the electromechanical coupling coefficient of the surface acoustic wave resonator, a method for reducing the film thickness of the electrodes constituting the IDT and the reflectors in the surface acoustic wave resonator may be used.

Figure 14:
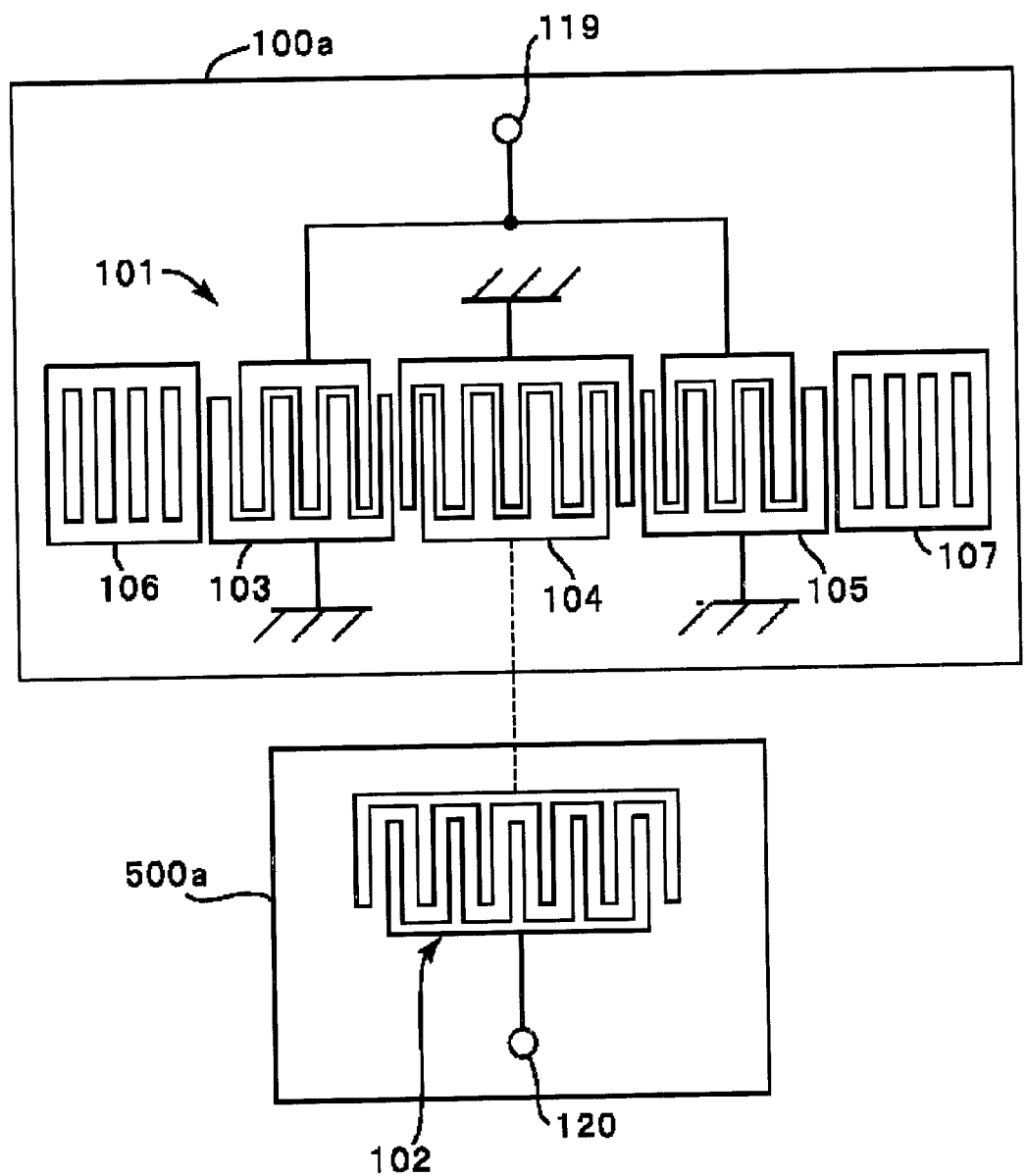
FIG. 14 is a schematic plan view explaining a surface acoustic wave filter in accordance with a modification of the second preferred embodiment.

Also, as in the illustrated modification in FIG. 14, a surface acoustic wave resonator 501 may be provided on a piezoelectric substrate 500a other than the piezoelectric substrate on which the longitudinally-coupled resonator-type surface acoustic wave filter 101 is disposed. In this case, as the piezoelectric substrate 500a, for example, a piezoelectric substrate which has a smaller electromechanical coupling coefficient-than that of the 40±5°, Y-cut, X-propagation LiTaO$_3$ substrate, such as a quartz substrate, a 45°, X-cut, Z-propagation Li$_2$B$_4$O$_7$ substrate, a X-cut, 112°, Y-propagation LiTaO$_3$ substrate, or a langasite substrate may be used.

Figure 15:
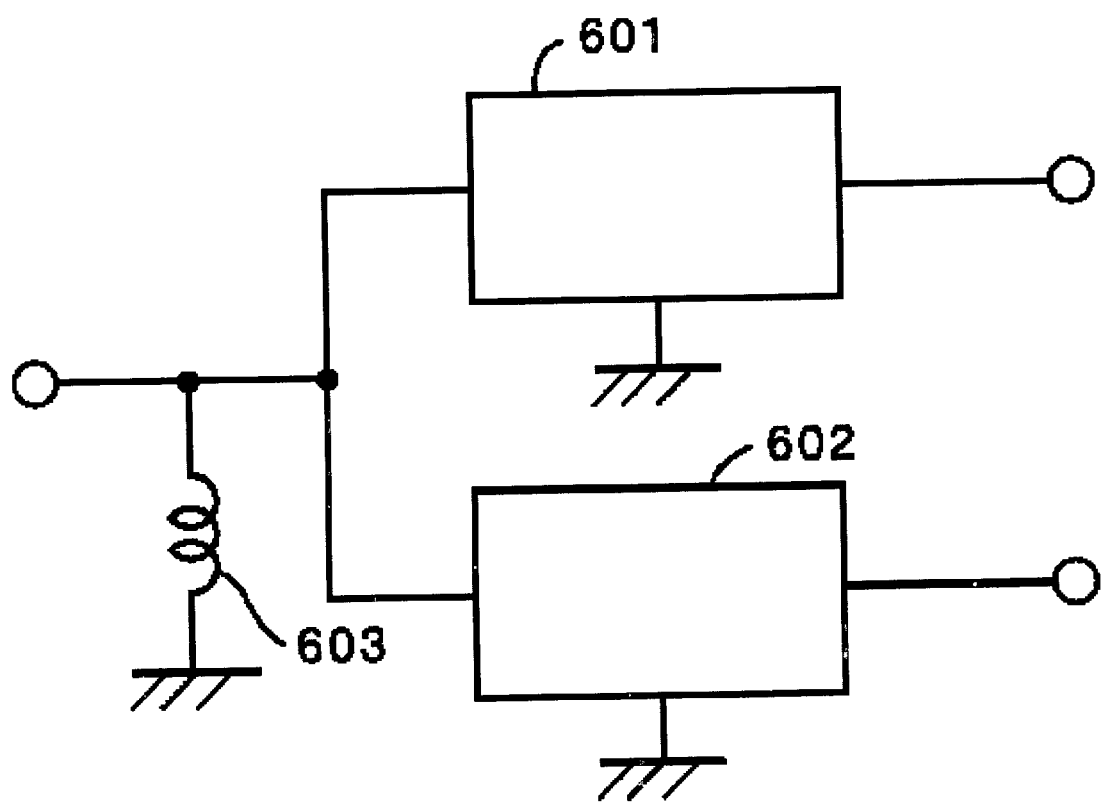
FIG. 15 is a schematic block diagram showing a surface acoustic wave filter having two surface acoustic wave filter elements.

FIG. 15 is a circuit diagram illustrating a third preferred embodiment in accordance with the present invention.

Figure 16:
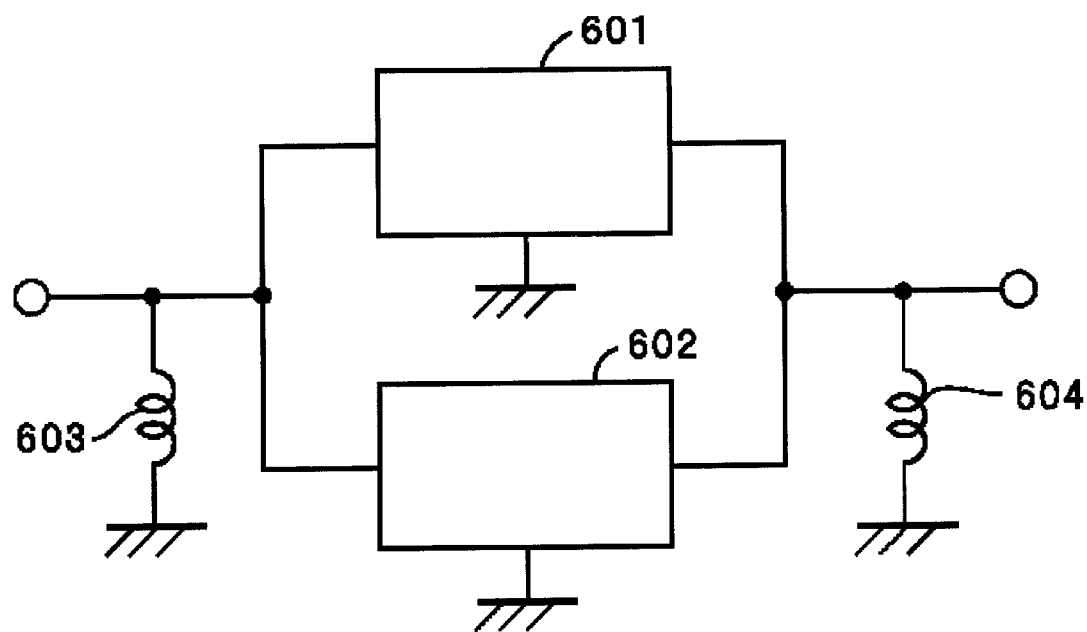
FIG. 16 is a schematic block diagram showing a surface acoustic wave filter having two surface acoustic wave filter elements.

The surface acoustic wave filter in accordance with preferred embodiments of the present invention often requires an impedance matching element such as an inductance element. When a matching element is disposed outside a package, the mounting area becomes large. Also, as in the illustrated circuitry in FIG. 15, in the configuration wherein one of the input terminal side and the output terminal side of the surface acoustic wave filters 601 and 602 is made common, an external inductance element 603 is often connected, in order to achieve an impedance matching on the side which is commonly connected. Likewise, as in the illustrated example in FIG. 16, in the configuration wherein both of the input terminal side and the output terminal side of the surface acoustic wave filters 601 and 602 are made common, inductance elements 603 and 604 are often inserted, in order to achieve impedance matchings on both of input terminal side and output terminal side.

Thus, when commonly connecting one-side terminals of two surface acoustic wave filters, an external inductance for impedance matching has previously been inserted. In the surface acoustic wave filters shown in FIGS. 15 and 16, by using the surface acoustic wave filter in accordance with preferred embodiments of the present invention as one of surface acoustic wave filters 601 and 602, the advantageous effects of the present invention can be achieved without adding an impedance matching element.

Figure 17:
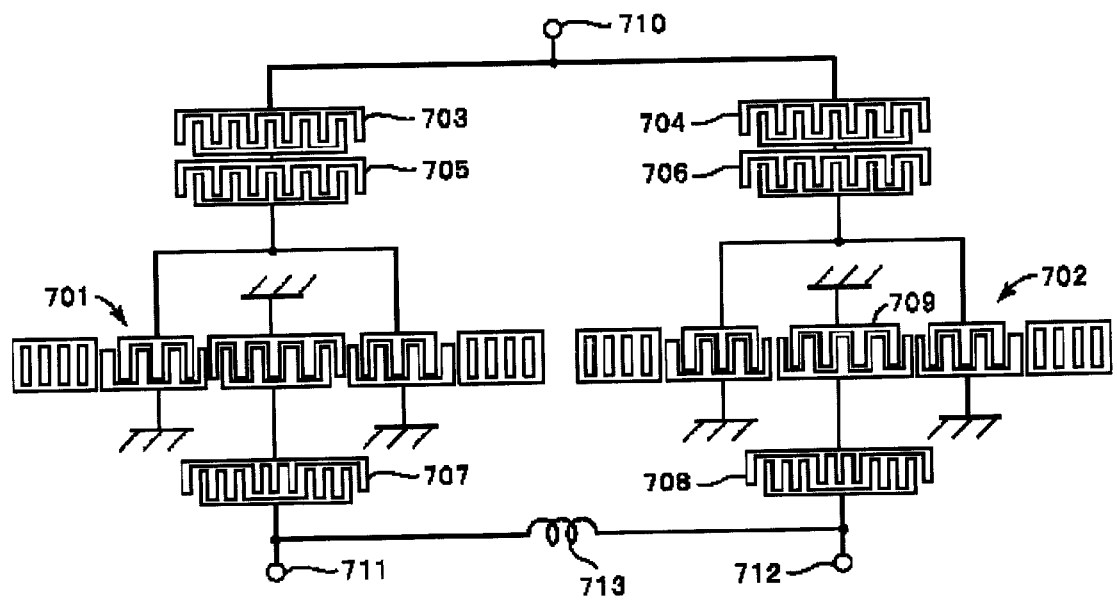
FIG. 17 is a schematic plan view showing the electrode structure of a longitudinally-coupled resonator-type surface acoustic wave filter in accordance with a third preferred embodiment of the present invention.

FIG. 17 is a schematic plan view for explaining a surface acoustic wave filter in accordance with a third preferred embodiment of the present invention. In the third preferred embodiment, a first surface acoustic wave filter portion including a longitudinally-coupled resonator-type surface acoustic wave filter 701 and surface acoustic wave resonators 703, 705, and 707, and a second surface acoustic wave filter portion including a longitudinally-coupled resonator-type surface acoustic wave filter 702 and surface acoustic wave resonators 704, 706, and 708, are connected in parallel with each other. As in the case of the first preferred embodiment, the first and second surface acoustic wave filter portions have the longitudinally-coupled resonator-type surface acoustic wave filters 701 and 702, and the surface acoustic wave resonators 707 and 708 connected in series therewith, respectively. Also, as in the case of the modification shown in FIG. 11, the surface acoustic wave resonators 703 and 705, and 704 and 706 are connected between an input terminal 710 and the longitudinally-coupled resonator-type surface acoustic wave filters 701 and 702, respectively. The third preferred embodiment of the present invention, therefore, has a configuration such that two of the surface acoustic wave filters in accordance with the modification shown in FIG. 11 are connected in parallel with each other.

Herein, an inductance 713 is connected between output terminals 711 and 712.

Thus, in this preferred embodiment of the present invention, by connecting two of the surface acoustic wave filters in accordance with preferred embodiments of the present invention in parallel with each other, a surface acoustic wave filter, of which the input impedance is about 50Ω and the output impedance is about 200Ω, and which has a balanced-to-unbalanced conversion function, is provided.

The longitudinally-coupled resonator-type surface acoustic wave filters 701 and 702, and the surface acoustic wave resonators 703 to 708 are all designed similar to the surface acoustic wave filters shown in FIGS. 1 and 11, except that the crossing width of the electrode fingers in all of the above-described longitudinally-coupled resonator-type surface acoustic wave filters 701 and 702 and the surface acoustic wave resonators 703 to 708 is a half of that in the surface acoustic wave filters shown in FIGS. 1 and 11, and that the IDT 709 of the longitudinally-coupled resonator-type surface acoustic wave filter 702 is inverted with respect to the IDTs of the surface acoustic wave filters shown in FIGS. 1 and 11. The purpose of inverting the polarity of the central IDT 709 of the longitudinally-coupled resonator-type surface acoustic wave filter 702 is to shift the phase of output signals of the longitudinally-coupled resonator-type surface acoustic wave filter 702 by 180 degrees with respect to the phase of output signals of the longitudinally-coupled resonator-type surface acoustic wave filter 701.

The method for shifting the phase by 180 degrees is not limited to this method.

In this design example, the inductance element 713 connected between the output terminals 711 and 712, which are balanced output terminals, are preferably set to a value of about 15 nH.

Figure 18:
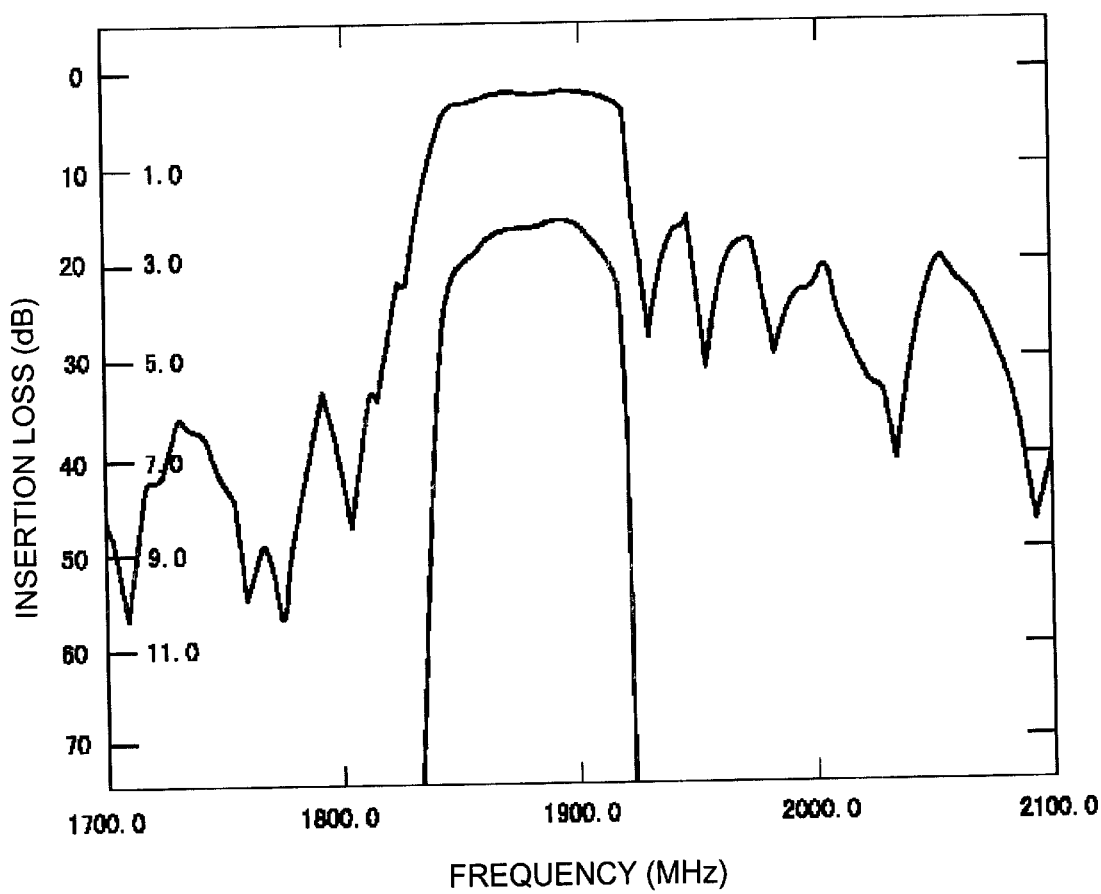
FIG. 18 is a diagram showing the attenuation-frequency characteristic of the surface acoustic wave filter in accordance with the third preferred embodiment of the present invention.

FIG. 18 shows the frequency characteristic of the surface acoustic wave filter in accordance with the third preferred embodiment of the present invention. As can be seen from FIG. 18, a steepness of the attenuation-frequency characteristic in the immediate vicinity of the higher frequency side of the pass band substantially equal to that obtained in the first preferred embodiment can be realized. This shows that, in accordance with the third preferred embodiment of the present invention, there is provided a surface acoustic wave filter which allows the steepness of the attenuation-frequency characteristic in the immediate vicinity of the higher frequency side of the pass band to be improved, and which has a balanced-to-unbalanced conversion function.

Figure 19:
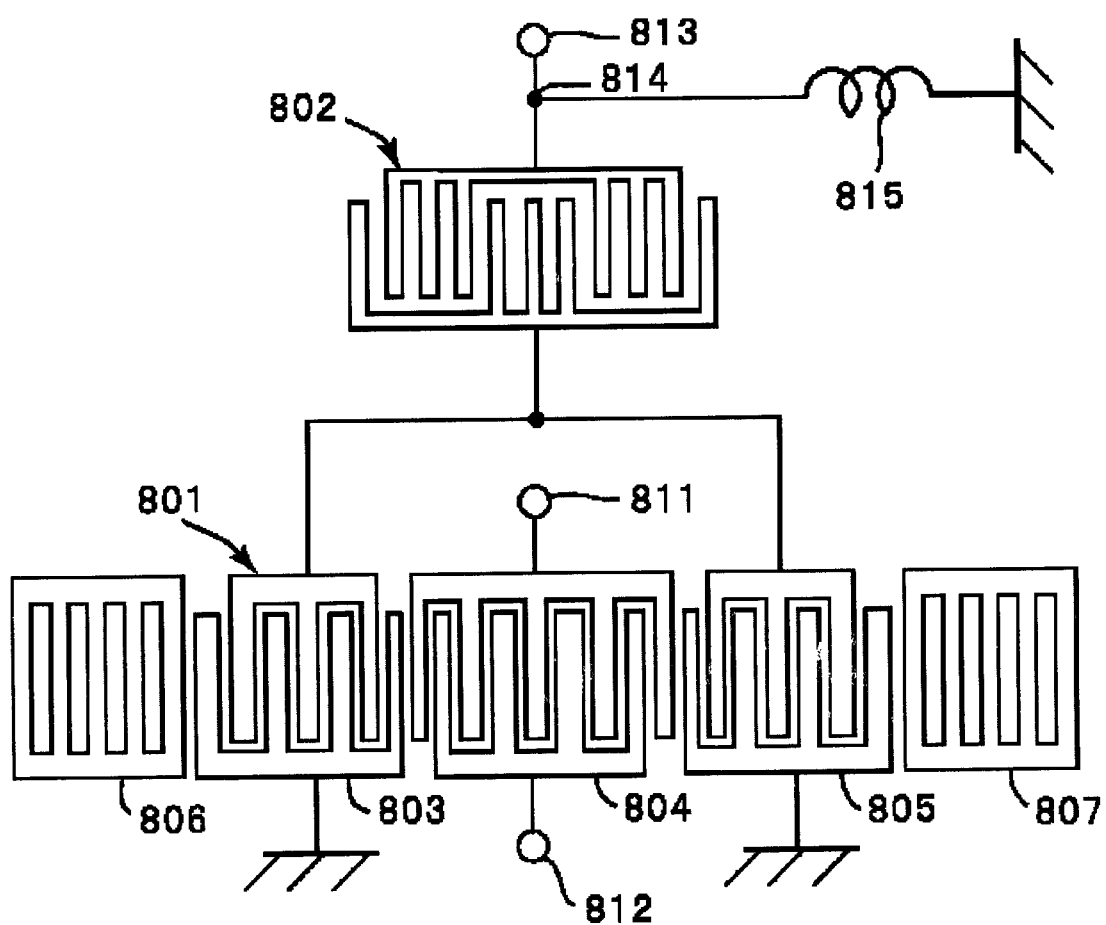
FIG. 19 is a schematic plan view showing the electrode structure of a surface acoustic wave filter in accordance with a modification of the third preferred embodiment of the present invention.

In the third preferred embodiment, description has been given of a surface acoustic wave filter of which the input impedance and the output impedance are different from each other, and which has a balanced-to-unbalanced conversion function. Alternately, however, a surface acoustic wave filter of which the input impedance and the output impedance are substantially equal to each other, and which has a balanced-to-unbalanced conversion function can be achieved. For example, in a modification shown in FIG. 19, a surface acoustic wave resonator 802 is connected in series with a longitudinally-coupled resonator-type surface acoustic wave filter 801. Herein, both ends of the central IDT 804 of the longitudinally-coupled resonator-type surface acoustic wave filter 801 are connected to balanced terminals 811 and 812 for taking out balanced outputs. On end of each of the IDTs 803 and 805 is connected to the surface acoustic wave resonator 802. The end portion of the surface acoustic wave resonator 802 opposite the side to which the IDTs 803 and 805 are connected, is connected to an unbalanced input terminal 813. An inductance element 815 is inserted between the connection point 814, which is between the unbalanced input terminal 813 and the surface acoustic wave resonator 802, and the ground potential. Here, reference numerals 806 and 807 each denote reflectors.

By thus connecting both ends of the IDT 804 to the balanced output terminals 811 and 812, there is provided a surface acoustic wave filter of which the input impedance and the output impedance are substantially equal to each other, and which has a balanced-to-unbalanced conversion function. In this case also, by designing the longitudinally-coupled resonator-type surface acoustic wave filter 801, the surface acoustic wave resonator 802, and the inductance element 815, in accordance with the above-described preferred embodiments, the steepness of the attenuation-frequency characteristic is effectively improved in the immediate vicinity of the higher frequency side of the pass band.

In the above-described preferred embodiments, as a piezoelectric substrate, a 40±5°, Y-cut, X-propagation LiTaO$_3$ substrate has been used, but in the present invention, the piezoelectric substrate is not restricted to the above-described LiTaO$_3$ substrate. Alternatively, in the present invention, various substrates having piezoelectricity can be used, such as a 64 to 72°, Y-cut, X-propagation LiNbO$_3$ substrate, a Y-cut, X-propagation LiNbO$_3$ substrate, and other suitable substrates.

In the first preferred embodiment, a pass band has been formed using the resonant modes A and B shown in FIGS. 8A and 8B, and the resonant mode by the inductance of the surface acoustic wave resonator 102. However, when a narrow pass band is enough, a pass band may be formed of two resonant modes: the resonant mode B and the resonant mode generated by the inductance of the surface acoustic wave resonator 102, by adjusting the design parameters and also disposing the resonant mode A outside the pass band.

Furthermore, when a wider pass band than that of the conventional longitudinally-coupled resonator-type surface acoustic wave filter is required, a pass band may be formed of four resonant modes: the three resonant modes of A to C shown in FIGS. 8A and 8B, and the resonant mode generated by the inductance of the surface acoustic wave resonator 102.

In the above-described preferred embodiments, examples each of which uses a longitudinally-coupled resonator-type surface acoustic wave filter having three IDTs have been shown, but in the present invention, a longitudinally-coupled resonator-type surface acoustic wave filter having two IDTs or one having at least four IDTs may be used instead.

Figure 20:
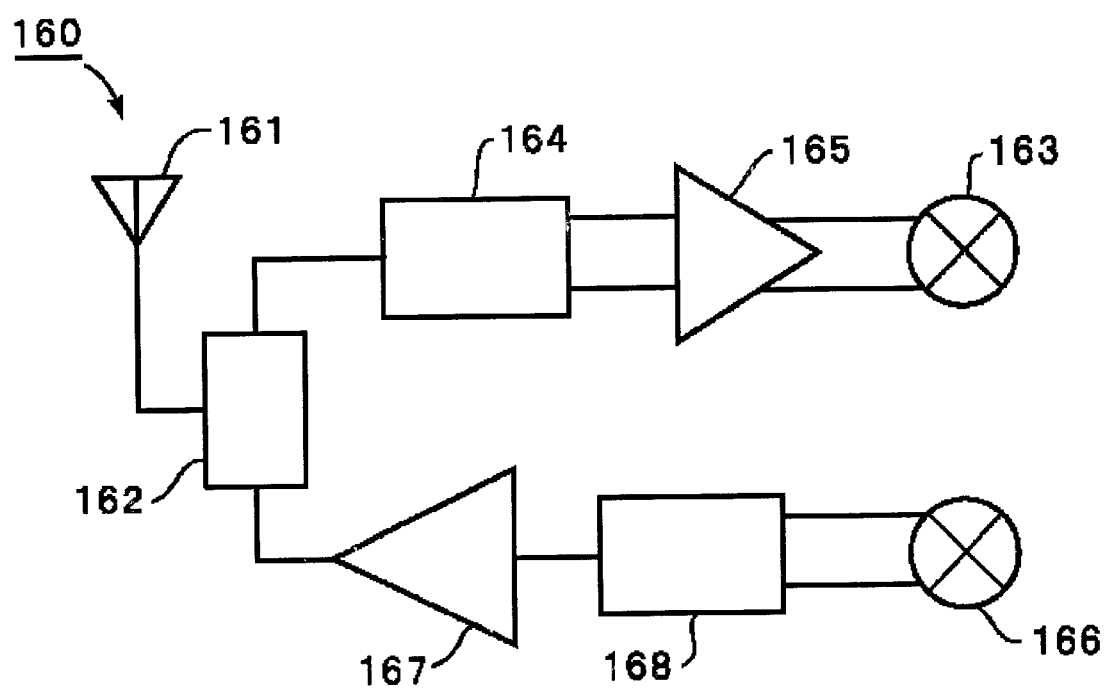
FIG. 20 is a schematic block diagram explaining a communication device which includes a surface acoustic wave filter in accordance with other preferred embodiments of the present invention.
Figure 21:
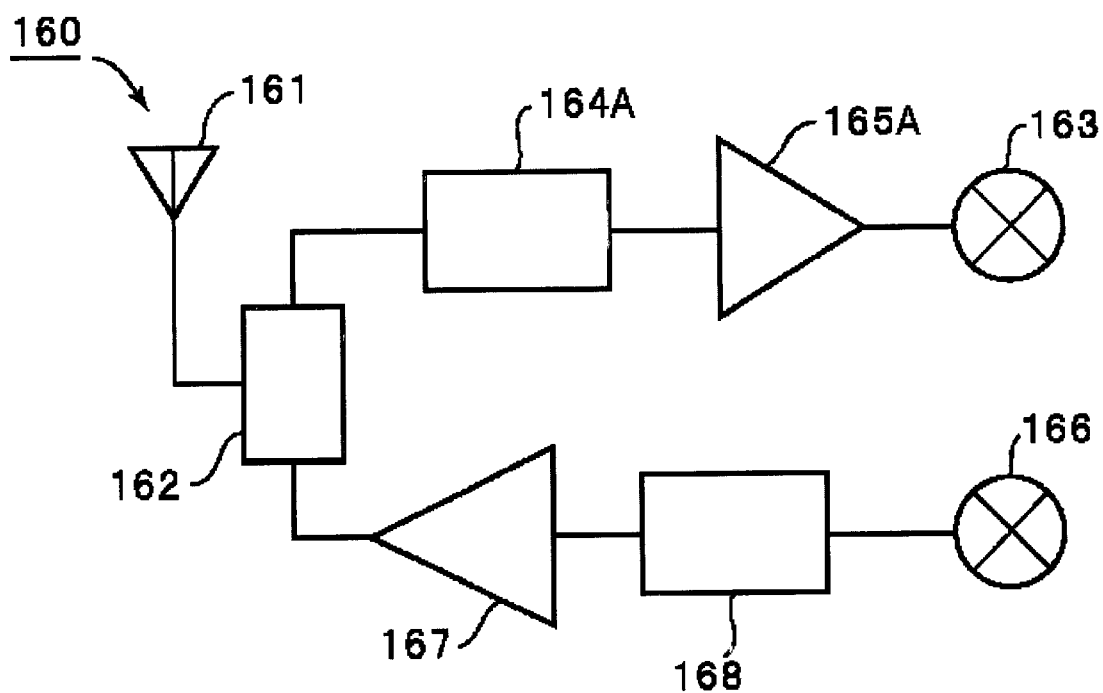
FIG. 21 is a schematic block diagram explaining another example of communication device which includes a surface acoustic wave filter in accordance with other preferred embodiments of the present invention.

FIGS. 20 and 21 are each schematic block diagrams illustrating a communication device 160 which uses a surface acoustic wave filter in accordance with preferred embodiments of the present invention.

In FIG. 20, a duplexer 162 is connected to an antenna 161. A surface acoustic wave filter 164 and an amplifier 165 are connected between the duplexer 162 and a receiving-side mixer 163. Also, an amplifier 167 and a surface acoustic wave filter 168 are connected between the duplexer 162 and a transmitting-side mixer 166. When the amplifier 165 is adaptable to balanced signals, a surface acoustic wave filter constructed in accordance with preferred embodiments of the present invention can be suitably used as the above-mentioned surface acoustic wave filter 164.

Also, as shown in FIG. 21, when the amplifier 165A used on the receiving-side is adaptable to unbalanced signals, a surface acoustic wave filter constructed in accordance with preferred embodiments of the present invention can be suitably used as a surface acoustic wave filter 164A, as well.

As is evident from the foregoing description, in the surface acoustic wave filter in accordance with preferred embodiments of the present invention, in the configuration including a longitudinally-coupled resonator-type surface acoustic wave filter and a surface acoustic wave resonator connected in series therewith, a pass band is formed by utilizing at least one of the resonant modes of the longitudinally-coupled resonator-type surface acoustic wave filter and the inductance of the surface acoustic wave resonator. Therefore, the steepness of the filter characteristic of the surface acoustic wave resonator can be utilized as a steepness of the filter characteristic of the surface acoustic wave resonator, as it is. Hence, by using a surface acoustic wave resonator having a narrow frequency distance between the resonant frequency and the antiresonant frequency, the steepness of the filter characteristic in the immediate vicinity of the higher frequency side of the pass band is effectively increased.

When the antiresonant frequency of the surface acoustic wave resonator is positioned at a lower frequency than the frequency in the resonant mode positioned on the highest frequency side, of the resonant modes of the longitudinally-coupled resonator-type surface acoustic wave filter, the steepness of the attenuation-frequency characteristic in the immediate vicinity of the higher frequency side of the pass band is improved even more effectively.

When the resonant frequency of the surface acoustic wave resonator is positioned at a higher frequency than the frequency in the resonant mode positioned on the highest frequency side, of the resonant modes which constitute the pass band of the longitudinally-coupled resonator-type surface acoustic wave filter, the resonant mode generated by the influence of the inductance of the surface acoustic wave resonator occurs. By substantially matching the impedance of the above-described resonant mode with that of the other resonant mode of the longitudinally-coupled resonator-type surface acoustic wave filter, the pass band can be widened.

When the resultant impedance of the surface acoustic wave resonator and the longitudinally-coupled resonator-type surface acoustic wave filter is substantially matched with the impedance in the resonant mode of the longitudinally-coupled resonator-type surface acoustic wave filter, the widening of the pass band is achieved.

When the VSWR value at the frequency at the attenuation pole generated by the resultant impedance of the surface acoustic wave resonator and the longitudinally-coupled resonator-type surface acoustic wave filter is not less than about 3.5, the attenuation value in the immediate vicinity of the higher frequency side of the pass band can be made sufficient. In the configuration wherein the surface acoustic wave resonator is to be subjected to weighting by electrode-finger withdrawal, the steepness of the attenuation-frequency characteristic in the immediate vicinity of the higher frequency side of the pass band can be reliably improved by performing weighting by electrode-finger withdrawal so as to reduce the frequency distance between the resonant frequency and the antiresonant frequency of the surface acoustic wave resonator.

When the surface acoustic wave resonator has a smaller electromechanical coupling coefficient than that of the longitudinally-coupled resonator-type surface acoustic wave filter, the frequency distance between the resonant frequency and the antiresonant frequency of the surface acoustic wave resonator can be reduced, and thereby the steepness of the attenuation-frequency characteristic in the immediate vicinity of the higher frequency side of the pass band can be effectively increased. In this case, the surface acoustic wave resonator may be formed using a piezoelectric substrate having a smaller electromechanical coupling coefficient than that of the longitudinally-coupled resonator-type surface acoustic wave filter.

When there is provided at least one inductance element connected in parallel with the input and/or output terminal to which the surface acoustic wave resonator is connected in series, the filter characteristic in the pass band can be improved.

When the surface acoustic wave filter has at least two surface acoustic wave filter elements, at least one of the input terminal side and the output terminal side of the two surface acoustic wave filter elements is made common, and at least one of the two surface acoustic wave filter elements is constituted of a surface acoustic wave filter in accordance with preferred embodiments of the present invention, this surface acoustic wave resonator doubles as the above-described inductance element, so that the simplification of the structure of the surface acoustic wave filter can be achieved.

The surface acoustic wave filter in accordance with preferred embodiments of the present invention may be configured so as to have a balanced-to-unbalanced conversion function. In this case, a surface acoustic wave filter which has a balanced-to-unbalanced conversion function, and in which the steepness of the filter characteristic in the immediate vicinity of the higher frequency side of the pass band is improved in accordance with preferred embodiments of the present invention, can be provided.

Since the communication device in accordance with preferred embodiments of the present invention is configured using a surface acoustic wave filter in accordance with other preferred embodiments of the present invention, the steepness of the filter characteristic in the immediate vicinity of the higher frequency side of the pass band in the surface acoustic wave filter is increased, and thereby, a communication device having a superior selectivity can be provided.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. A surface acoustic wave filter, comprising:
   a longitudinally-coupled resonator-type surface acoustic wave filter having a piezoelectric substrate and at least two interdigital transducers disposed on the piezoelectric substrate along the propagation direction of a surface acoustic wave generated therein; and
   at least one surface acoustic wave resonator connected between at least one of an input terminal and an output terminal of the surface acoustic wave filter, and said longitudinally-coupled resonator-type surface acoustic wave filter;
   wherein a pass band is generated by utilizing at least one of the resonant modes of said longitudinally-coupled resonator-type surface acoustic wave filter and inductance of said at least one surface acoustic wave resonator.

2. A surface acoustic wave filter in accordance with claim 1, wherein the antiresonant frequency of said at least one surface acoustic wave resonator is set at a frequency lower than that of the resonant mode positioned on the highest frequency side, among the resonant modes of said longitudinally-coupled resonator-type surface acoustic wave filter.

3. A surface acoustic wave filter in accordance with claim 1, wherein the resonant frequency of said at least one surface acoustic wave resonator is set at a frequency higher than that of the resonant mode positioned on the highest frequency side, among the resonant modes which constitute the pass band of said longitudinally-coupled resonator-type surface acoustic wave filter.

4. A surface acoustic wave filter in accordance with claim 1, wherein the resultant impedance of said at least one surface acoustic wave resonator and said longitudinally-coupled resonator-type surface acoustic wave filter is substantially matched with the impedance in the resonant mode of said longitudinally-coupled resonator-type surface acoustic wave filter.

5. A surface acoustic wave filter in accordance with claim 1, wherein the VSWR value at the frequency at the attenuation pole generated by the resultant impedance of said at least one surface acoustic wave resonator and said longitudinally-coupled resonator-type surface acoustic wave filter is equal to or greater than about 3.5.

6. A surface acoustic wave filter in accordance with claim 1, wherein said at least one surface acoustic wave resonator is subjected to weighting by electrode-finger withdrawal.

7. A surface acoustic wave filter in accordance with claim 1, wherein said at least one surface acoustic wave resonator has a smaller electromechanical coupling coefficient than that of said longitudinally-coupled resonator-type surface acoustic wave filter.

8. A surface acoustic wave filter in accordance with claim 7, wherein said at least one surface acoustic wave resonator includes a piezoelectric substrate which has a smaller electromechanical coupling coefficient than the piezoelectric substrate of said longitudinally-coupled resonator-type surface acoustic wave filter.

9. A surface acoustic wave filter in accordance with claim 1, further comprising:
   at least one inductance element connected in parallel with at least one of the input terminal and the output terminal to which said at least one surface acoustic wave resonator is connected in series.

10. A surface acoustic wave filter in accordance with claim 1, further comprising means for performing a balanced-to-unbalanced conversion function.

11. A communication device comprising a surface acoustic wave filter in accordance with claim 1.

12. A surface acoustic wave filter, comprising:
   at least two surface acoustic wave filter elements;
   wherein at least one of the input terminal side and the output terminal side of said at least two surface acoustic wave filter elements is a common terminal for each of said at least two surface acoustic wave filter elements; and
   wherein at least one of said two surface acoustic wave filter elements is constituted of a surface acoustic wave filter including:
      a longitudinally-coupled resonator-type surface acoustic wave filter having a piezoelectric substrate and at least two interdigital transducers disposed on the piezoelectric substrate along the propagation direction of a surface acoustic wave generated therein; and
      at least one surface acoustic wave resonator connected between at least one of an input terminal and an output terminal of the surface acoustic wave filter, and said longitudinally-coupled resonator-type surface acoustic wave filter;
      wherein a pass band is generated by utilizing at least one of the resonant modes of said longitudinally-coupled resonator-type surface acoustic wave filter and inductance of said at least one surface acoustic wave resonator.

13. A surface acoustic wave filter in accordance with claim 12, wherein the resonant frequency of said at least one surface acoustic wave resonator is set at a frequency higher than that of the resonant mode positioned on the highest frequency side, among the resonant modes which constitute the pass band of said longitudinally-coupled resonator-type surface acoustic wave filter.

14. A surface acoustic wave filter in accordance with claim 12, wherein the resultant impedance of said at least one surface acoustic wave resonator and said longitudinally-coupled resonator-type surface acoustic wave filter is substantially matched with the impedance in the resonant mode of said longitudinally-coupled resonator-type surface acoustic wave filter.

15. A surface acoustic wave filter in accordance with claim 12, wherein the VSWR value at the frequency at the attenuation pole generated by the resultant impedance of said at least one surface acoustic wave resonator and said longitudinally-coupled resonator-type surface acoustic wave filter is equal to or greater than about 3.5.

16. A surface acoustic wave filter in accordance with claim 12, wherein said at least one surface acoustic wave resonator is subjected to weighting by electrode-finger withdrawal.

17. A surface acoustic wave filter in accordance with claim 12, wherein said at least one surface acoustic wave resonator has a smaller electromechanical coupling coefficient than that of said longitudinally-coupled resonator-type surface acoustic wave filter.

18. A surface acoustic wave filter in accordance with claim 17, wherein said at least one surface acoustic wave resonator includes a piezoelectric substrate which has a smaller electromechanical coupling coefficient than the piezoelectric substrate of said longitudinally-coupled resonator-type surface acoustic wave filter.

19. A surface acoustic wave filter in accordance with claim 12, further comprising:
    at least one inductance element connected in parallel with at least one of the input terminal and the output terminal to which said at least one surface acoustic wave resonator is connected in series.

20. A surface acoustic wave filter in accordance with claim 12, further comprising means for performing a balanced-to-unbalanced conversion function.

21. A surface acoustic wave filter in accordance with claim 12, wherein the anti-resonant frequency of said at least one surface acoustic wave resonator is set at a frequency lower than that of the resonant mode positioned on the highest frequency side, among the resonant modes of said longitudinally-coupled resonator-type surface acoustic wave filter.

22. A communication device comprising a surface acoustic wave filter in accordance with claim 12.

* * * * *